(12) United States Patent
An et al.

(10) Patent No.: US 12,028,999 B2
(45) Date of Patent: Jul. 2, 2024

(54) ELECTRONIC DEVICE INCLUDING DISPLAY

(71) Applicant: SAMSUNG ELECTRONICS CO., LTD., Suwon-si (KR)

(72) Inventors: Jungchul An, Suwon-si (KR); Jaehwan Park, Suwon-si (KR); Kwonho Song, Suwon-si (KR); Shinhyuk Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 17/841,346

(22) Filed: Jun. 15, 2022

(65) Prior Publication Data

US 2022/0312612 A1   Sep. 29, 2022

Related U.S. Application Data

(63) Continuation of application No. PCT/KR2021/011065, filed on Aug. 20, 2021.

(30) Foreign Application Priority Data

Oct. 22, 2020 (KR) .................. 10-2020-0137256
Jul. 30, 2021 (KR) .................. 10-2021-0100435

(51) Int. Cl.
*B32B 7/12* (2006.01)
*B32B 15/09* (2006.01)
(Continued)

(52) U.S. Cl.
CPC ............... *H05K 5/03* (2013.01); *B32B 7/12* (2013.01); *B32B 15/09* (2013.01); *B32B 17/10* (2013.01);
(Continued)

(58) Field of Classification Search
CPC ..... B32B 15/09; B32B 17/10; B32B 2255/28; B32B 2307/4023; B32B 2307/42;
(Continued)

(56) References Cited

U.S. PATENT DOCUMENTS 8,582,047 B2   11/2013   Tho et al.
10,545,537 B2   1/2020   Ahn et al.
(Continued)

FOREIGN PATENT DOCUMENTS

KR     10-1654940      10/2011
KR     10-2019-0071134   6/2019
(Continued)

*Primary Examiner* — Alicia J Weydemeyer
(74) *Attorney, Agent, or Firm* — NIXON & VANDERHYE P.C.

(57) ABSTRACT

Disclosed is an electronic device including: a foldable display panel, a glass disposed in a first direction facing a front surface of the display panel, a protection layer disposed in the first direction of the glass, a first printing layer disposed between the glass and the protection layer, and a second printing layer disposed in a second direction opposite a first direction, the first printing layer being spaced apart from an edge of the glass in a third direction facing an active area of the display panel, and one end of the second printing layer corresponds to an edge of the display panel.

13 Claims, 28 Drawing Sheets

(51) Int. Cl.
  *B32B 17/10* (2006.01)
  *B32B 27/08* (2006.01)
  *B32B 27/28* (2006.01)
  *B32B 27/36* (2006.01)
  *H05K 5/00* (2006.01)
  *H05K 5/02* (2006.01)
  *H05K 5/03* (2006.01)

(52) U.S. Cl.
  CPC ............ *B32B 27/08* (2013.01); *B32B 27/281* (2013.01); *B32B 27/36* (2013.01); *H05K 5/0017* (2013.01); *H05K 5/0226* (2013.01); *B32B 2255/28* (2013.01); *B32B 2307/4023* (2013.01); *B32B 2307/42* (2013.01); *B32B 2457/20* (2013.01)

(58) Field of Classification Search
  CPC ... B32B 2457/20; B32B 27/08; B32B 27/281; B32B 27/36; B32B 7/12
  See application file for complete search history.

(56) References Cited

U.S. PATENT DOCUMENTS

| | | | |
|---|---|---|---|
| 10,908,647 | B2 | 2/2021 | Ahn et al. |
| 10,983,626 | B2 | 4/2021 | Chan et al. |
| 2011/0260989 | A1 | 10/2011 | Tho et al. |
| 2016/0067946 | A1* | 3/2016 | Ma .............. B32B 7/12 156/60 |
| 2016/0209970 | A1* | 7/2016 | Lee ............ G06F 1/1652 |
| 2016/0223722 | A1* | 8/2016 | Ahn ............ G02B 1/14 |
| 2016/0357318 | A1 | 12/2016 | Chan et al. |
| 2017/0146698 | A1* | 5/2017 | Kim ............ G02B 5/003 |
| 2018/0364759 | A1 | 12/2018 | Ahn et al. |
| 2020/0221587 | A1 | 7/2020 | An |
| 2021/0124401 | A1 | 4/2021 | Ahn et al. |
| 2021/0223904 | A1 | 7/2021 | Chan et al. |

FOREIGN PATENT DOCUMENTS

| | | |
|---|---|---|
| KR | 10-2019-0072134 | 6/2019 |
| KR | 10-2020-0086505 | 7/2020 |

* cited by examiner

ELECTRONIC DEVICE INCLUDING DISPLAY

CROSS-REFERENCE TO RELATED APPLICATIONS

This application is a continuation of International Application No. PCT/KR2021/011065 designating the United States, filed on Aug. 20, 2021, in the Korean Intellectual Property Receiving Office and claiming priority to Korean Patent Application No. 10-2020-0137256, filed on Oct. 22, 2020, in the Korean Intellectual Property Office and Korean Patent Application No. 10-2021-0100435, filed on Jul. 30, 2021, in the Korean Intellectual Property Office, the disclosures of all of which are incorporated by reference herein in their entireties.

BACKGROUND

Field

The disclosure relates to an electronic device including a display.

Description of Related Art

An electronic device may include a display that displays a screen. The display may include an active area that is an area for displaying the screen, and a non-display area that surrounds the active area. A printing layer may be disposed along an edge of an active area to alleviate a phenomenon, in which an interior of an edge in an active area is visually recognized when the display is viewed from a front side. The printing layer may include a material that shields light.

The display may include a plurality of layers including a display panel, in which pixels are disposed. In recent years, like foldable electronic devices, electronic devices that may change states of the electronic devices and displays into a folded state and a flat state have appeared. A plurality of layers may be implemented such that the display may be folded or unfolded a plurality of times. For example, the plurality of layers may include a flexible material. As another example, thicknesses of the plurality of layers may be reduced.

The plurality of layers that comprise the display may include glass. The glass may be disposed between a protection layer for protecting a front surface of a display panel and the display panel. The glass may improve a visibility, an aesthetic performance, and a haptic feeling of the front surface of the display. A thickness of the glass disposed in the foldable electronic device may be decreased to fold or unfold the display a plurality of times. As a thickness of the glass decreases, an edge of the glass may be cracked or chipped.

It may be necessary to inspect whether the edge of the glass on the front surface of the display is cracked or chipped. When a printing layer is disposed along an edge of an active area, it may not be easy to inspect whether the edge of the glass is cracked or chipped.

SUMMARY

Embodiments of the disclosure provide an electronic device including a display, in which a printing layer is disposed such that it may be inspected to determine whether an edge of glass is cracked or chipped.

An electronic device according to an example embodiment of the disclosure includes: a display panel configured to have a folded state and a flat state, a glass disposed in a first direction to which a front surface of the display panel faces, a protection layer disposed in the first direction of the glass, a first printing layer disposed between the glass and the protection layer, and a second printing layer disposed in a second direction to which a rear surface of the glass faces, the first printing layer is spaced apart from an edge of the glass in a third direction facing an active area of the display panel, and one end of the second printing layer corresponds to an edge of the display panel.

An electronic device according to an example embodiment of the disclosure includes: a display panel configured to have a folded state and a flat state, a glass disposed in a first direction of the display panel, a protection layer disposed in the first direction of the glass, a first printing layer disposed between the glass and the protection layer, and a second printing layer disposed in a second direction to which a rear surface of the glass faces, the first printing layer is spaced apart from an edge of the glass by a first distance in a third direction facing an active area of the display panel, one end of the second printing layer corresponds to an edge of the display panel, and the first printing layer and the second printing layer may overlap each other by a second distance when viewed from the first direction.

According to various example embodiments of the disclosure, a first printing layer disposed on a glass is disposed to be spaced apart from an edge of the glass whereby the device may be inspected to determine whether the edge of the glass is cracked or chipped.

According to various example embodiments of the disclosure, a second printing layer is disposed under a glass to at least partially overlap the first printing layer whereby a phenomenon, in which a structure of an edge of a display is visually recognized, may be alleviated.

In addition, the present disclosure may provide various effects that are directly or indirectly recognized.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With regard to description of drawings, the same or similar components may be marked by the same or similar reference numerals.

DETAILED DESCRIPTION

Hereinafter, various example embodiments of the disclosure will be described with reference to the accompanying drawings. Accordingly, those of ordinary skill in the art will recognize that various modifications, equivalents, and/or alternatives on the various example embodiments described herein can be variously made without departing from the scope and spirit of the disclosure.

Figure 1:
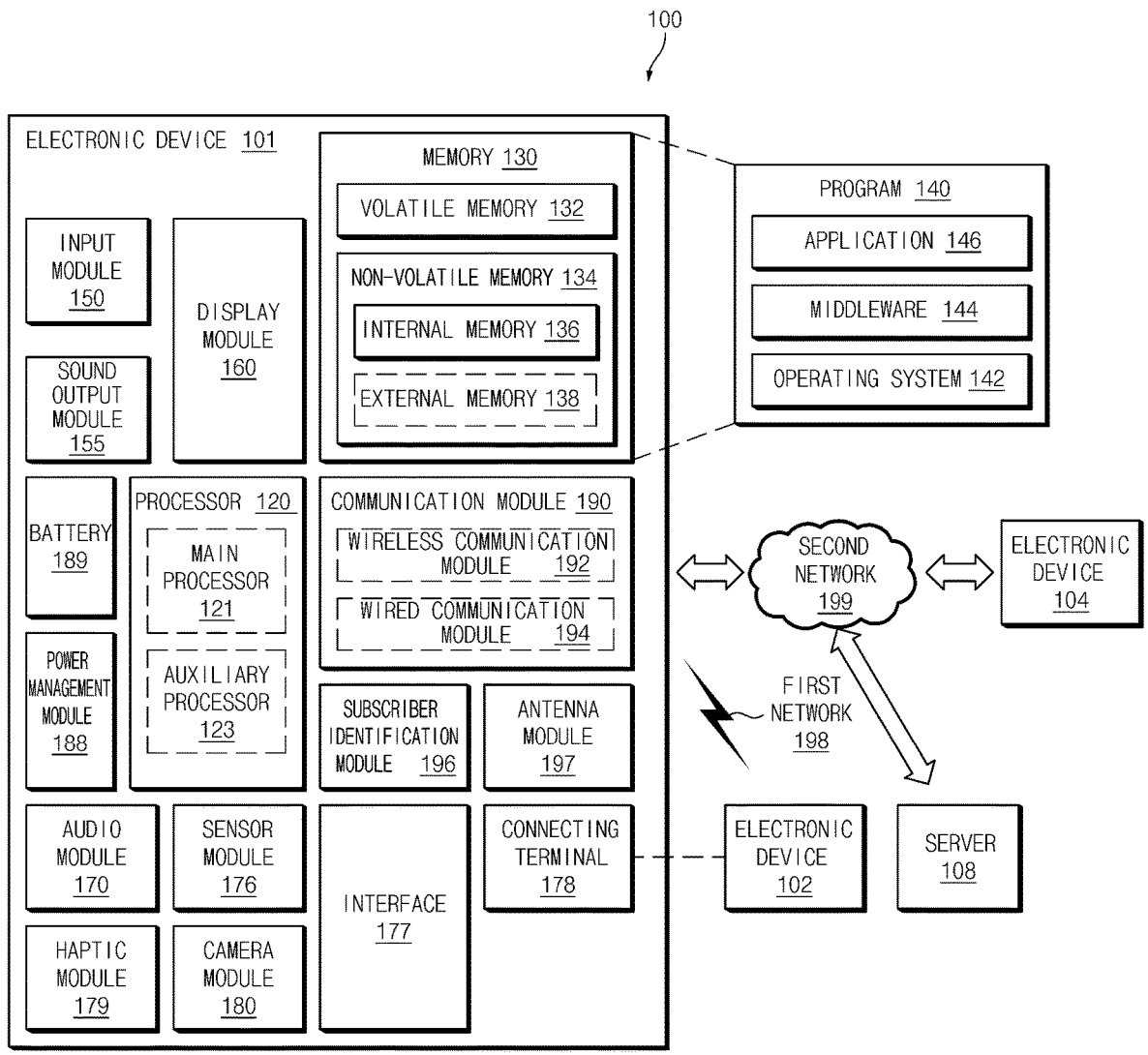
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., by wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
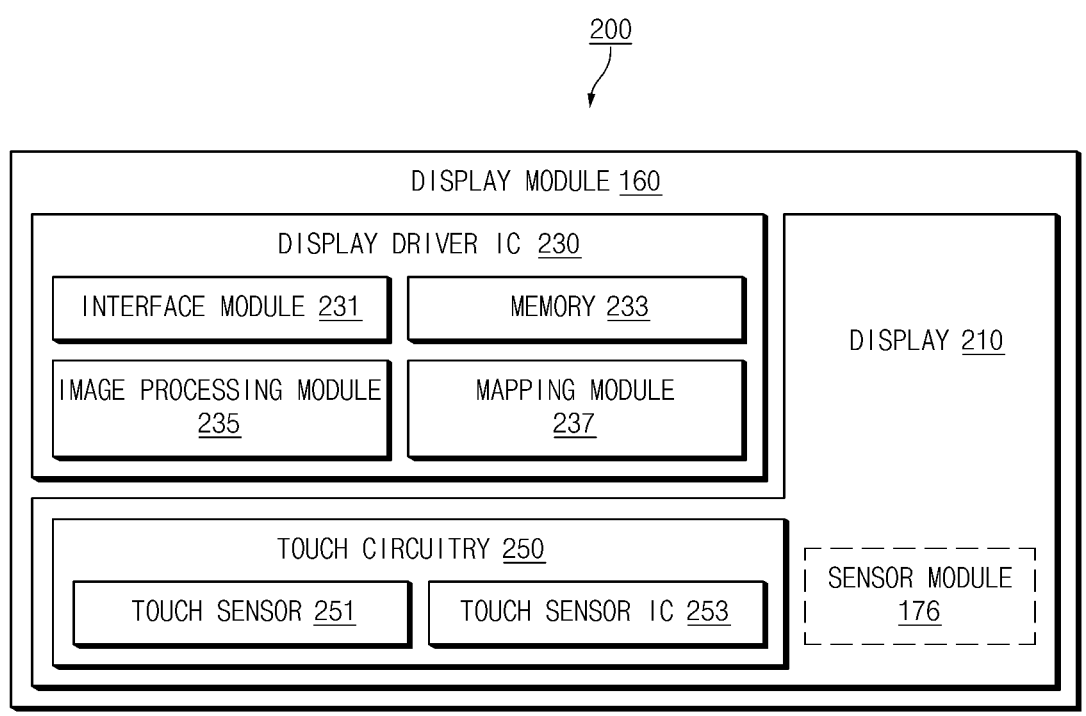
FIG. 2 is a block diagram illustrating an example configuration of the display module according to various embodiments.

FIG. 2 is a block diagram 200 illustrating an example configuration of the display module 160 according to various embodiments. Referring to FIG. 2, the display module 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or a luminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
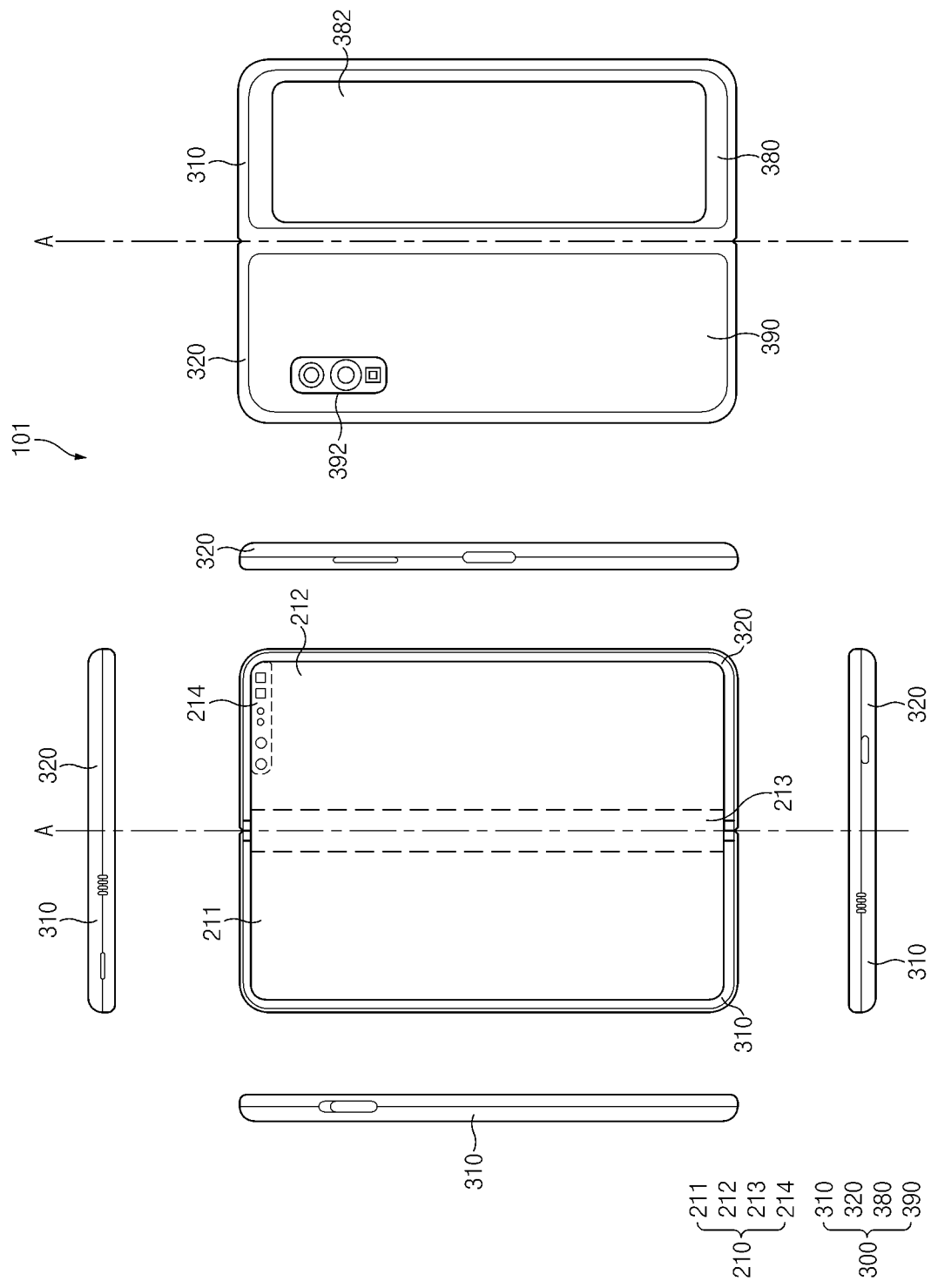
FIG. 3 is a diagram illustrating a flat state of a foldable electronic device according to various embodiments.

FIG. 3 is a diagram illustrating a flat state of a foldable electronic device 101 according to various embodiments. The electronic device 101 according to an embodiment may be a foldable electronic device 101 that may change the electronic device 101 and the display 210 into a folded state and a flat state.

In an embodiment, the electronic device 101 may include a housing 300, a hinge cover 330 (refer to FIG. 4) that covers the housing 300, and the display 210 disposed in a space defined by the housing 300. In the disclosure, a surface on which the display 210 is disposed is defined as a first surface or a front surface (front side) of the electronic device 101. Furthermore, in the disclosure, an opposite surface of the front surface is defined as a second surface or a rear surface of the electronic device 101. A surface that surrounds a space between the front surface and the rear surface is defined as a third surface or a side surface of the electronic device 101.

In an embodiment, the housing 300 include a first front housing 310, a second front housing 320, a first rear cover 380, and a second rear cover 390. The housing 300 may not be limited to the forms and couplings illustrated in FIGS. 3 and 4. The housing 300 may be implemented by different shape, or different combinations and/or couplings of components. For example, in an embodiment, the first front housing 310 and the first rear cover 380 may be integrally formed. Furthermore, in an embodiment, the second front housing 320 and the second rear cover 390 may be integrally formed.

In an embodiment, the first front housing 310 and the second front housing 320 may be disposed on opposite sides of a folding axis (axis "A") that is a border line, about which the electronic device 101 and the display 210 are folded. The first front housing 310 and the second front housing 320 may have shapes that are symmetrical to each other with respect to the folding axis "A" as a whole. An angle or a distance between the first front housing 310 and the second front housing 320 may be different according to whether a state of the electronic device 101 and the display 210 is a flat state, a folded state, or an intermediate state.

In an embodiment, the first front housing 310 and the second front housing 320 may include a recess that accommodates the display 210. At least a portion of the first front housing 310 and the second front housing 320 may be formed of a metallic material or a nonmetallic material having a strength of a specific threshold value or more to support the display 210.

In an embodiment, the display 210 may be disposed in a space defined by the housing 300. For example, the display 210 may be seated on the recess defined by the housing 300. The display 210 may comprise most of the front surface of the electronic device 101.

In an embodiment, at least a partial area of the display 210 may be deformed to a flat surface or a curved surface. The display 210 may include a folding area 213 that is a folded or unfolded area, a first area 211 disposed on one side (e.g., a left side of the folding area 213 illustrated in FIG. 3) of the folding area 213, and a second area 212 disposed on an opposite side (e.g., a right side of the folding area 213 illustrated in FIG. 2) of the folding area 213. Classification of the areas of the display 210 illustrated in FIG. 3 is illustrative, and the display 210 may be divided into a plurality of areas according to a structure or a function thereof. For example, as in the display 210 illustrated in FIG. 3, the areas of the display 210 may be divided by the folding area 213 or the folding axis (axis "A") formed long in a longitudinal direction of the display 210. As another example, the areas of the display 210 may be divided with respect to a folding area or another folding axis formed long in a transverse direction of the display 210. The first area 211 and the second area 212 may have shapes that are symmetrical to each other with respect to the folding area 213 as a whole. However, when a sensor area is included in the display 210, the first area 211 and the second area 212 may have asymmetric shapes.

In an embodiment, the display 210 may further include a sensor area 214. The sensor area 214 may occupy a specific area in the second area 212 of the display 210. However, the disclosure is not limited thereto, and the sensor area 214 may be formed in the first area 211 or may be divided to be formed in the first area 211 and the second area 212.

In an embodiment, the sensor area 214 may be adjacent to an edge on one side of the first front housing 310 and/or the second front housing 320. For example, the sensor area 214 may be adjacent to an upper end corner of the second front housing 320. The arrangement, shape, or size of the sensor area 214 is not limited to the illustrated example. For example, the sensor area 214 may be formed in an arbitrary area at a lower end corner or between the upper end corner and the lower end corner of the second front housing 320. The sensor area 214 may be disposed at a lower end of the first area 211 and/or the second area 212 of the display 210. The display 210 of FIG. 3 may be an infinity-O display, of which a whole part except for holes of a front camera or a sensor is implemented as a display area and in which the sensor area 214 including the front camera is integrally formed with the first area 211 and/or the second area 212 of the display 210.

In an embodiment, a pixel structure of the first area 211 and/or the second area 212 disposed in an upper end of the sensor area 214 may be different from a pixel structure of the remainder of the first area 211 and/or the second area 212. For example, a pixel structure of the first area 211 and/or the second area 212 disposed in an upper end of the sensor area 214 may have a pixel density that is lower than that of a pixel structure of the remainder of the first area 211 and/or the second area 212. As another example, pixels of the first area 211 and/or the second area 212 disposed in an upper end of the sensor area 214 may have smaller sizes that are smaller than those of pixels of the remainder of the first area 211 and/or the second area 212. As another example, forms and shapes of pixels of the first area 211 and/or the second area 212 disposed in an upper end of the sensor area 214 may have smaller widths or be slimmer than those of pixels of the remainder of the first area 211 and/or the second area 212.

In an embodiment, the components for performing various functions embedded in the electronic device 101 may be visually exposed to the front surface of the electronic device 101 through the sensor area 214 or through one or more openings provided in the sensor area 214. In various embodiments, the components may include various kinds of sensors (e.g., the sensor module 176 of FIG. 1). The sensors, for example, may include at least one of a front camera, a receiver, or a proximity sensor.

In an embodiment, the first rear cover 380 may be disposed on the rear surface of the electronic device 101. The first rear cover 380 may be disposed on one side of the folding axis (axis A). The first rear cover 380 may have a substantially rectangular edge (periphery). The edge of the first rear cover 380 may be surrounded by the first front housing 310.

In an embodiment, the second rear cover 390 may be disposed on the rear surface of the electronic device 101. The second rear cover 390 may be disposed on an opposite side to the first rear cover 380 with respect to the folding axis (axis A). The second rear cover 390 may have a substantially rectangular edge. The edge of the second rear cover 390 may be surrounded by the second front housing 320.

In an embodiment, the first rear cover 380 and the second rear cover 390 may have shapes that are substantially symmetrical to each other with respect to the folding axis (axis A). However, the first rear cover 380 and the second rear cover 390 do not necessarily have mutually symmetrical shapes, and in an embodiment, the electronic device 101 may include the first rear cover 380 and the second rear cover 390 of various shapes. In an embodiment, the first rear cover 380 may be integrally formed with the first front housing 310, and the second rear cover 390 may be integrally formed with the second front housing 320.

In an embodiment, the front surface of the electronic device 101 may include the display 210, and a partial area of the first front housing 310 and a partial area of the second front housing 320, which are adjacent to the display 210. Further, the rear surface of the electronic device 101 may include the first rear cover 380, and a partial area of the first front housing 310, which is adjacent to the first rear cover 380, the second rear cover 390, and a partial area of the second front housing 320, which is adjacent to the second rear cover 390.

In an embodiment, the first front housing 310, the second front housing 320, the first rear cover 380, and the second rear cover 390 may provide spaces, in which various components (e.g., a printed circuit board or a battery) of the electronic device 101 may be disposed.

In an embodiment, one or more components may be disposed on the rear surface of the electronic device 101 or may be visually exposed. For example, at least a portion of a sub-display 382 may be visually exposed through the first rear cover 380. As another example, at least a portion of a rear sensor module 392 (e.g., the sensor module 176 of FIG. 1) may be visually exposed through the second rear cover 390. The rear sensor module 392 may include a proximity sensor and/or a rear camera.

According to an embodiment, when the electronic device 101 is in a flat state, the first front housing 310 and the second front housing 320 may be disposed to face the same direction while defining an angle of about 180 degrees therebetween. When the display 210 is in the flat state, a surface of the first area 211 and a surface of the second area 212 of the display 210 may mutually define about 180 degrees. When the display 210 is in the flat state, the first area 211 and the second area 212 of the display 210 may face the same direction (e.g., a forward direction of the electronic device 101). When the display 210 is in the flat state, the folding area 213 may define the same plane as those of the first area 211 and the second area 212.

Figure 4:
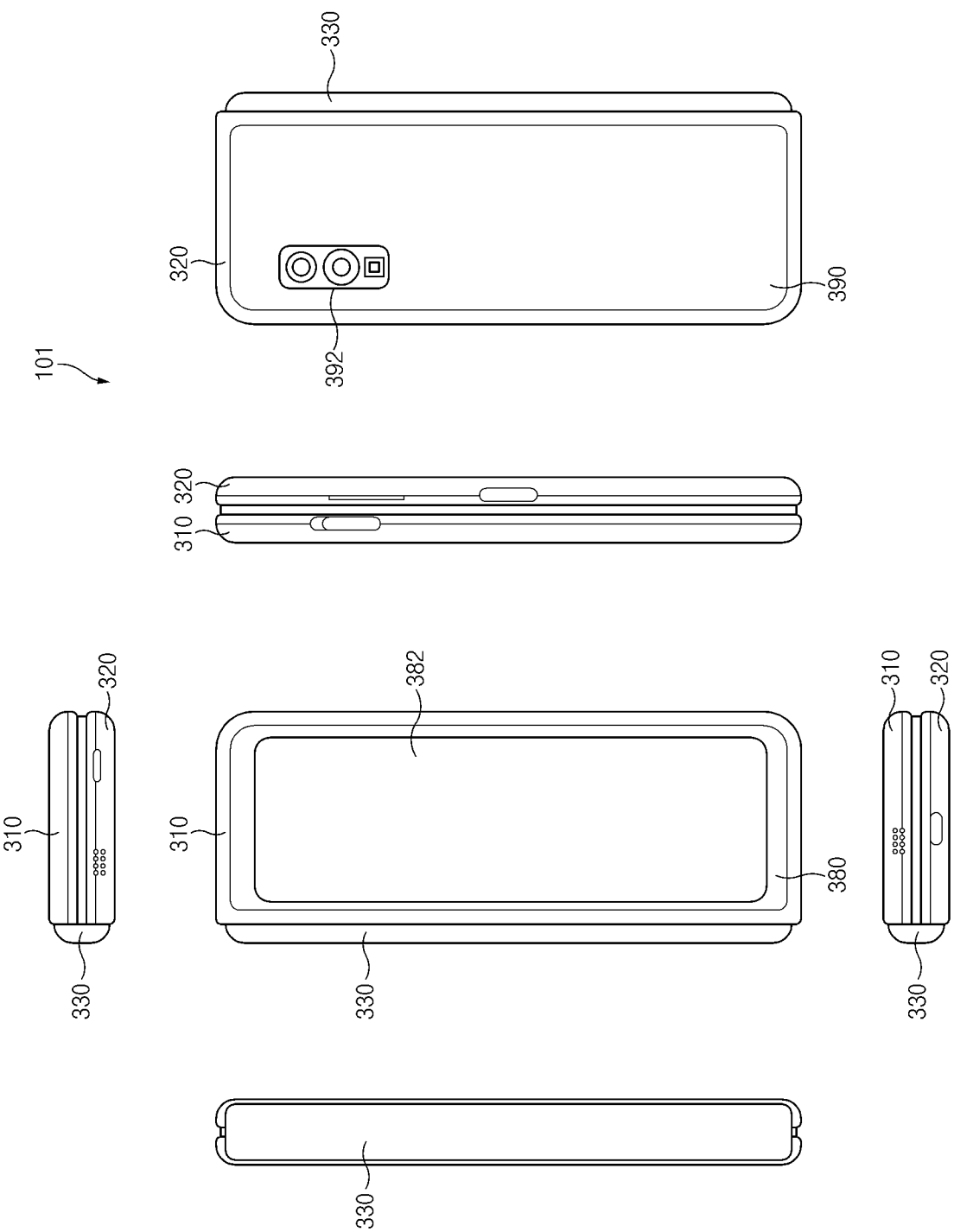
FIG. 4 is a diagram illustrating a folded state of a foldable electronic device according to various embodiments.

FIG. 4 is a diagram illustrating a folded state of the foldable electronic device 101 according to various embodiments.

In an embodiment, the hinge cover 330 may be disposed between the first front housing 310 and the second front housing 320. The hinge cover 330 may cover a space between the first front housing 310 and the second front housing 320. The hinge cover 330 may refer to a hinge structure between the first front housing 310 and the second front housing 320. When the electronic device 101 is in the flat state, the hinge cover 330 may be covered by a portion of the first front housing 310 and the second front housing 320. The hinge cover 330 may be exposed to an outside when the electronic device 101 is in the folded state. The hinge cover 330 may include a curved surface.

In an embodiment, when the electronic device 101 is in a folded state, the first front housing 310 and the second front housing 320 may be disposed to face each other. When the display 210 is in the folded state, a surface of the first area 211 and a surface of the second area 212 of the display 210 may mutually define a small angle (e.g., between 0 degrees to about 10 degrees). When the display 210 is in the folded state, the first area 211 and the second area 212 of the display 210 may face each other. When the display 210 is in the folded state, at least a portion of the folding area 213 may be changed to a curved surface having a first curvature.

In an embodiment, when the electronic device 101 is in an intermediate state between the flat state and the folded state, the first front housing 310 and the second front housing 320 may be disposed to define an angle of 0 degrees to 180 degrees. When the display 210 is in the intermediate state, a surface of the first area 211 and a surface of the second area 212 of the display 210 may define an angle that is larger than that in the folded state and smaller than that in the flat state. When the display 210 is in the intermediate state, at least a portion of the folding area 213 may be changed to a curved surface having a second curvature. The second curvature may be smaller than the first curvature.

Figure 5:
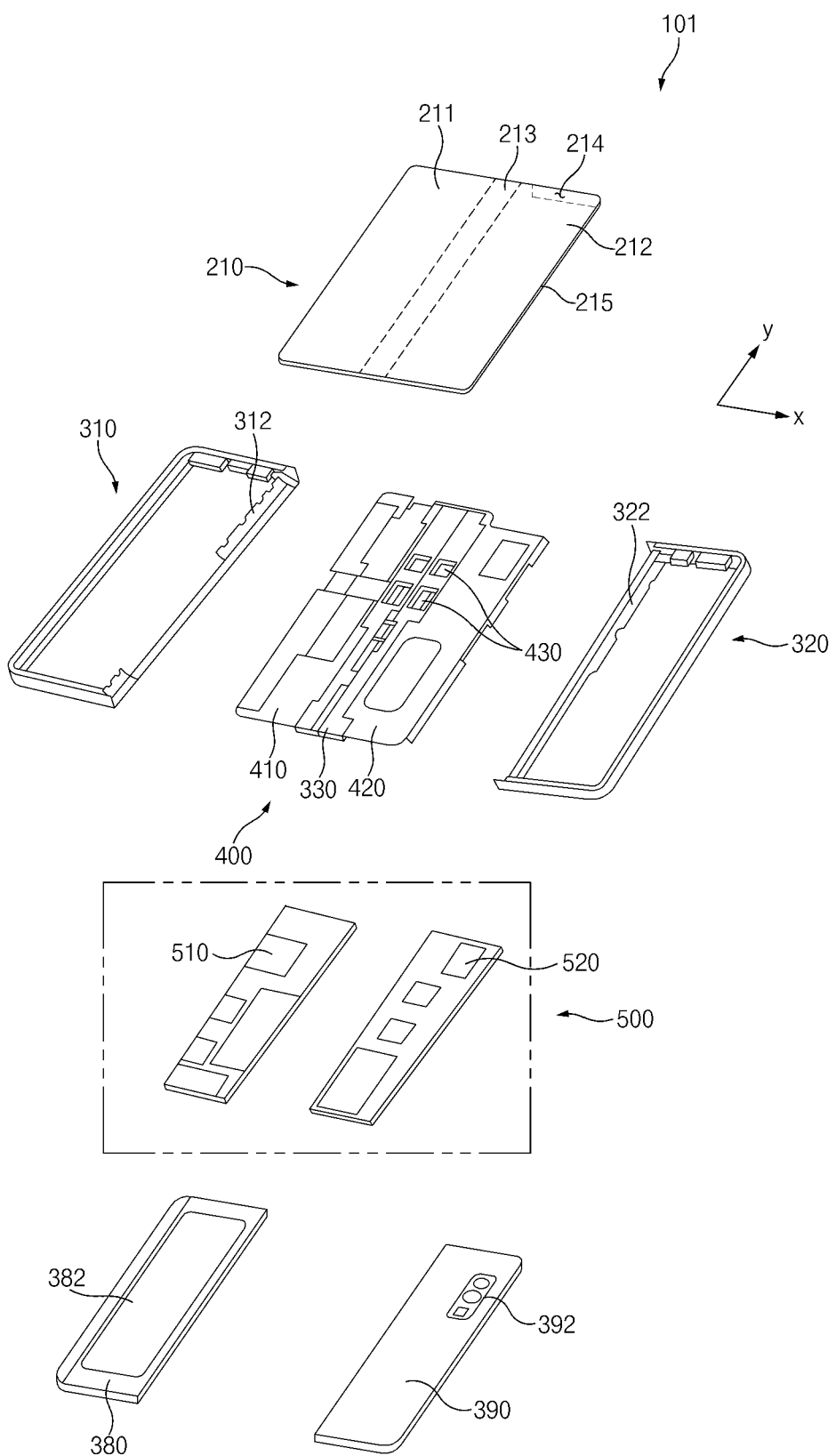
FIG. 5 is an exploded perspective view of an electronic device according to various embodiments

FIG. 5 is an exploded perspective view of the electronic device 101 according to various embodiments. The electronic device 101 according to an embodiment may include the display 210, a bracket assembly 400, a board part 500, the first front housing 310, the second front housing 320, the first rear cover 380, and the second rear cover 390.

In an embodiment, the display 210 may include the first area 211, the second area 212, the folding area 213, the sensor area 214, and a layer structure 215.

In an embodiment, the layer structure 215 may allow the display 210 to be seated in the recess of a housing 330. The layer structure 215 may include one or more plates. The layer structure 215 may be disposed on the bracket assembly 400.

In an embodiment, the bracket assembly 400 may be disposed between the layer structure 215 and the board part 500. The bracket assembly 400 may include a first bracket 410, a second bracket 420, the hinge cover 330 disposed between the first bracket 410 and the second bracket 420, and a wiring member 430 that crosses the first bracket 410 and the second bracket 420.

In an embodiment, the first bracket 410 may be disposed between the first area 211 of the display 210 and a first board 510 of the board part 500. The second bracket 420 may be disposed between the second area 212 of the display 210 and a second board 520 of the board part 500.

In an embodiment, the wiring member 430 may be disposed in a direction (e.g., the x axis direction) that crosses the first bracket 410 and the second bracket 420. The wiring member 430 may be disposed in a direction (e.g., the x axis direction) that is perpendicular to the folding axis (e.g., the y axis or the folding axis (axis A) of FIG. 3) of the folding area 213. The wiring member 430 may be a flexible printed circuit board (FPCB).

In an embodiment, the board part 500 may include the first board 510 disposed in the first bracket 410 and the second board 520 disposed in the second bracket 420. The first board 510 and the second board 520 may be disposed in an interior of a space defined by the bracket assembly 400, the first front housing 310, the second front housing 320, the first rear cover 380, and the second rear cover 390. Components for implementing various functions of the electronic device 101 may be disposed in the first board 510 and the second board 520.

In an embodiment, the first front housing 310 and the second front housing 320 may be assembled to be coupled to opposite sides of the bracket assembly 400 in a state in which the display 210 is coupled to the bracket assembly 400. The first front housing 310 and the second front housing 320 may be slid on the opposite sides of the bracket assembly 400 and be coupled to the bracket assembly 400.

In an embodiment, the first front housing 310 may include a first rotation support surface 312. The second front housing 320 may include a second rotation support surface 322 corresponding to the first rotation support surface 312. The first rotation support surface 312 and the second rotation support surface 322 may include curved surfaces corresponding to the curved surface included in the hinge cover 330.

In an embodiment, the first rotation support surface 312 and the second rotation support surface 322 may cover the hinge cover 330 when the electronic device 101 is in the flat state (e.g., the electronic device 101 of FIG. 3). Accordingly, when the electronic device 101 is in the flat state, the hinge cover 330 may not be exposed to the rear surface of the electronic device 101 or may be exposed minimally.

In an embodiment, the first rotation support surface 312 and the second rotation support surface 322 may be rotated along the curved surface included in the hinge cover 330 when the electronic device 101 is in the folded state (e.g., the electronic device 101 of FIG. 4). Accordingly, when the electronic device 101 is in the folded state, the hinge cover 330 may be exposed to the rear surface of the electronic device 101 minimally.

Figure 6:
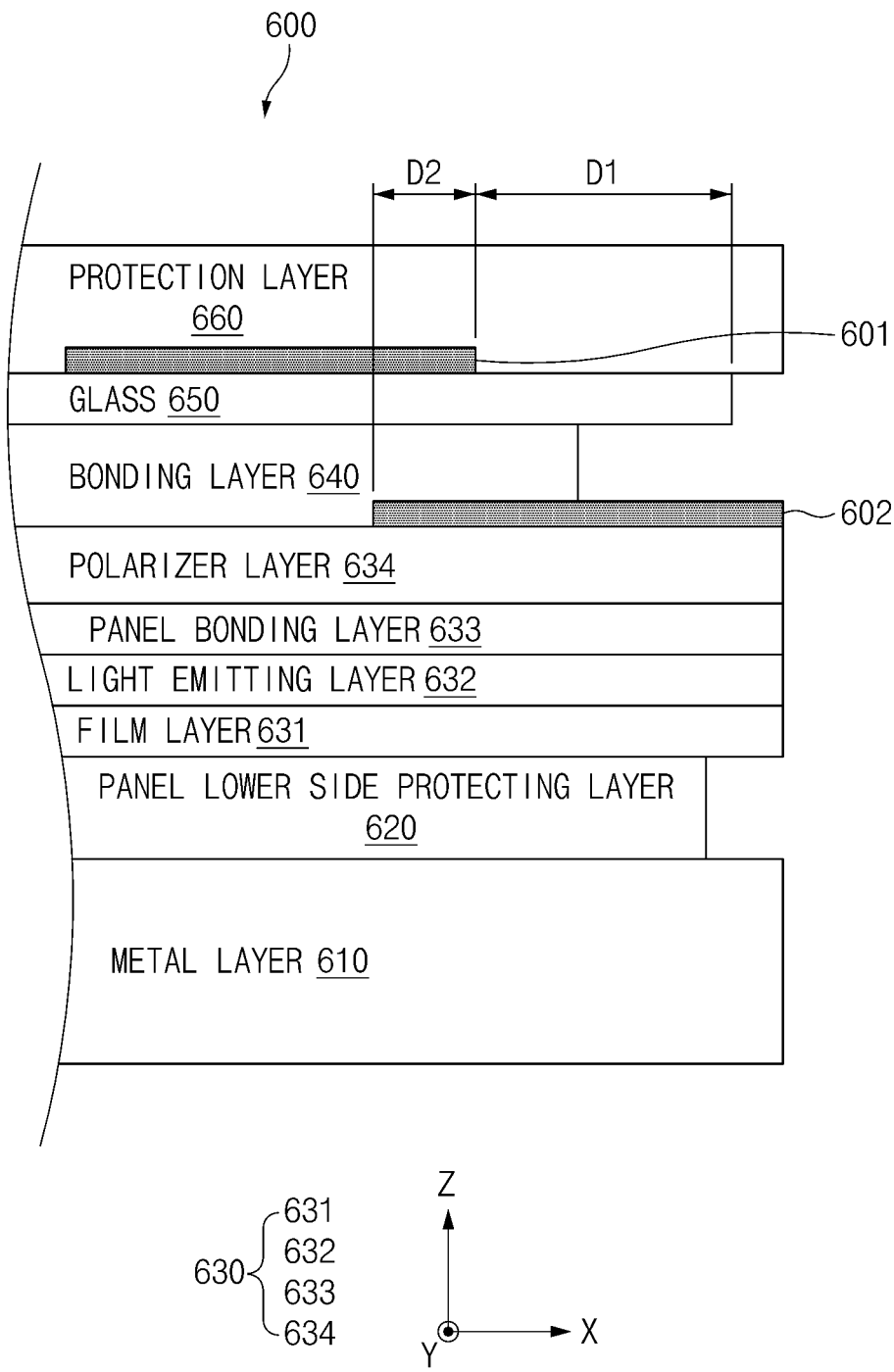
FIG. 6 is a side view of a display of an electronic device according to various embodiments.

FIG. 6 is a sectional side view 600 of a display (e.g., the display 210 of FIGS. 2 to 5) of an electronic device (e.g., the electronic device 101 of FIGS. 1 and 3 to 5) according to various embodiments. The display 210 of the electronic device 101 according to an embodiment may include a metal layer 610, a panel lower side protecting layer 620, a display panel 630, a bonding layer 640, a glass 650, a protection layer 660, a first printing layer 601, and a second printing layer 602.

In an embodiment, the metal layer 610 may form a rearmost layer with respect to a first direction (the +Z axis direction) that is a direction that faces a front side of the display 210. When the first direction (the +Z axis direction) faces an upper side, the metal layer 610 may be disposed at a lowermost end of the display 210. The metal layer 610 may be disposed in a second direction (the −Z axis direction) of the panel lower side protecting layer 620. A lower surface of the metal layer 610 may be viewed in the second direction (the −Z axis direction) that is an opposite direction to the first direction (the +Z axis direction). The second direction (the −Z axis direction) may be a direction that faces a rear side of the display 210. The metal layer 610 may contact the bracket assembly (e.g., the bracket assembly 400 of FIG. 5) disposed in the second direction (the −Z axis direction) of the display 210. The metal layer 610 may be electrically connected to the board part (e.g., the board part 500 of FIG. 5). The metal layer 610 may have a lattice structure. The metal layer 610 may apply a driving voltage for driving pixels included in the display 210. A thickness of the metal layer 610 may be larger than a thickness of the display panel 630. The thickness of the metal layer 610 may be about 150 μm to about 200 μm. As another example, the metal layer 610 may be electrically connected to a ground layer (not illustrated) of the board part (e.g., the board part 500 of FIG. 5).

In an embodiment, the panel lower side protecting layer 620 may be disposed in the first direction (the +Z axis direction) of the metal layer 610. When the first direction (the +Z axis direction) faces the upper side, the panel lower side protecting layer 620 may be disposed on the metal layer 610. The panel lower side protecting layer 620 may be disposed in the second direction (the −Z axis direction) of the display panel 630. The panel lower side protecting layer 620 may be disposed between the metal layer 610 and the display panel 630. An edge of the panel lower side protecting layer 620 may be spaced apart from an edge of the metal layer 610 in a third direction (the −X axis direction) that is perpendicular to the first direction (the +Z axis direction). The third direction (the −X axis direction) may be a direction that faces an active area that displays a screen in the display 210. The panel lower side protecting layer 620 may connect the metal layer 610 and the display panel 630. The panel lower side protecting layer 620 may be generally referred to as a C-panel. A thickness of the panel lower side protecting layer 620 may be about 60 μm to about 100 μm.

In an embodiment, the panel lower side protecting layer 620 may include an embossing layer, a cushion layer, a polyethylene terephthalate (PET) layer, and/or a composite sheet. The PET layer may be a colored layer such as a black layer.

In an embodiment, the display panel 630 may be disposed in the first direction (the +Z axis direction) of the panel lower side protecting layer 620. When the first direction (the +Z axis direction) faces the upper side, the display panel 630 may be disposed on the panel lower side protecting layer 620. An edge of the display panel 630 may be spaced apart from an edge of the panel lower side protecting layer 620 in the +X axis direction that is an opposite direction to the third direction (the −X axis direction). The edge of the display panel 630 may correspond to the edge of the metal layer 610. A thickness of the display panel 630 in the first direction (the +Z axis direction) may be larger than a thickness of the panel lower side protecting layer 620 in the first direction (the +Z axis direction). The thickness of the display panel 630 may be about 80 μm to about 120 μm. The display panel 630 may include an active area that displays the screen in the first direction (the +Z axis direction) and a non-display area that surrounds the active area. The display panel 630 may include one or more layers for displaying the screen.

In an embodiment, the one or more layers included in the display panel 630 may be manufactured in a one-to-one cutting scheme. Edges of the one or more layers included in the display panel 630 may be cut at once. Accordingly, the edges of the one or more layers included in the display panel 630 may correspond to each other.

In an embodiment, the display panel 630 may include a film layer 631, a light emitting layer 632, a panel bonding layer 633, and a polarizer layer 634.

In an embodiment, the film layer 631 may comprise a lower side of the display panel 630. The film layer 631 may be configured such that the display panel 630 may be flexibly folded. The film layer 631 may include polyimide and/or polyethylene terephthalate (PET).

In an embodiment, the light emitting layer 632 may be disposed in the first direction (the +Z axis direction) of the film layer 631. The light emitting layer 632 may display the screen by emitting light according to a driving voltage.

In an embodiment, the panel bonding layer 633 may be disposed in the first direction (the +Z axis direction) of the light emitting layer 632. The panel bonding layer 633 may couple the polarizer layer 634 to an upper side of the light emitting layer 632. The panel bonding layer 633 may include a pressure sensitive adhesive.

In an embodiment, the polarizer layer 634 may be disposed in the first direction (the +Z axis direction) of the panel bonding layer 633. The polarizer layer 634 may prevent and/or reduce at least a portion of the light input from an outside from being reflected by the display panel 630. The polarizer layer 634 may increase a visibility of the screen that is displayed by the light emitting layer 632.

Figure 8:
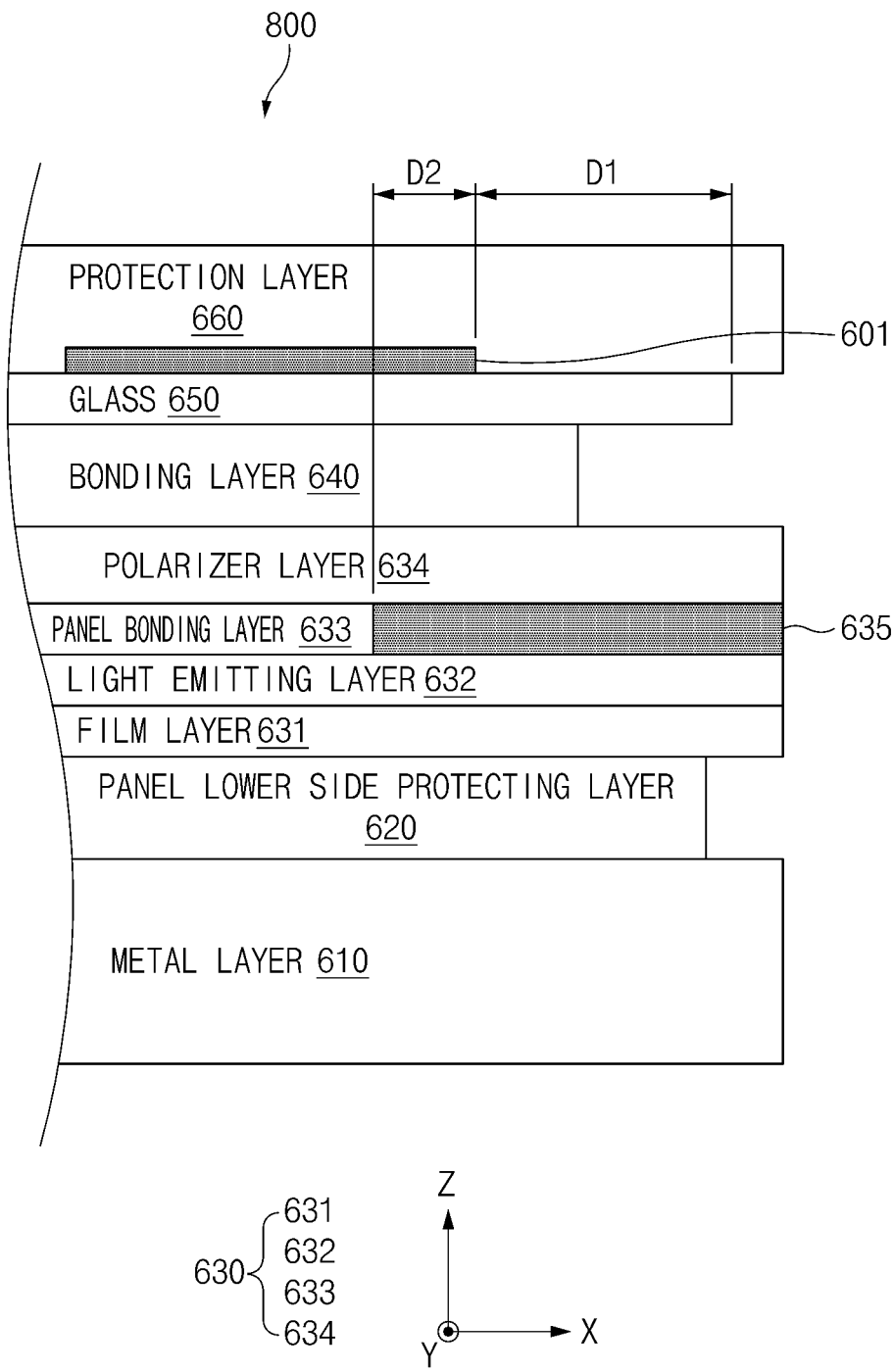
FIG. 8 is a side view of a display of an electronic device according to various embodiments.

In an embodiment, the polarizer layer 634 may be included in the light emitting layer 632. When the light emitting layer 632 includes a function of the polarizer layer 634, the polarizer layer 634 and the panel bonding layer 633 may be omitted. However, when a black bonding layer 635 of FIG. 8 is included, the polarizer layer 634 and the panel bonding layer 633 may be necessary.

In an embodiment, the bonding layer 640 may be disposed in the first direction (the +Z axis direction) of the display panel 630. When the first direction (the +Z axis direction) faces an upper side, the bonding layer 640 may be disposed on the display panel 630. The bonding layer 640 may be disposed between the display panel 630 and the glass 650. An edge of the bonding layer 640 may be spaced apart from an edge of the display panel 630 in the third direction (the −X axis direction). A thickness of the bonding layer 640 in the first direction (the +Z axis direction) may be smaller than a thickness of the display panel 630 in the first direction (the +Z axis direction). The thickness of the bonding layer 640 may be about 40 μm to about 60 μm. The bonding layer 640 may attach the glass 650 to an upper surface of the display panel 630. The bonding layer 640 may be a pressure sensitive adhesive (PSA). For example, the bonding layer 640 may include an optically clear adhesive (OCA).

In an embodiment, the glass 650 may be disposed in the first direction (the +Z axis direction) of the bonding layer 640. When the first direction (the +Z axis direction) faces the upper side, the glass 650 may be disposed on the bonding layer 640. An edge of the glass 650 may be spaced apart from an edge of the display panel 630 in the third direction (the −X axis direction). An edge of the glass 650 may be spaced apart from an edge of the bonding layer 640 in an opposite direction (the +X axis direction) to the third direction (the −X axis direction). A thickness of the glass 650 in the first direction (the +Z axis direction) may be smaller than a thickness of the bonding layer 640 in the first direction (the +Z axis direction). The thickness of the glass 650 may be about 25 μm to about 40 μm. When viewed from the first direction (the +Z axis direction), the glass 650 may improve a visibility and/or an aesthetic performance of the screen displayed on the display panel 630. The glass 650 may improve a haptic feeling when a user performs a touch input to the display panel 630 from the first direction (the +Z axis direction). The glass 650 may be an ultra-thin glass (UTG). The glass 650 may have a first strength.

In an embodiment, the protection layer 660 may be disposed in the first direction (the +Z axis direction) of the glass 650. When the first direction (the +Z axis direction) faces the upper side, the protection layer 660 may be disposed on the glass 650. The edge of the protection layer 660 may correspond to the edge of the display panel 630. An edge of the protection layer 660 may be spaced apart from an edge of the glass 650 in an opposite direction (the +X axis direction) to the third direction (the −X axis direction). A thickness of the protection layer 660 in the first direction (the +Z axis direction) may be larger than a thickness of the glass 650 in the first direction (the +Z axis direction). The thickness of the protection layer 660 may be about 40 μm to about 80 μm. The protection layer 660 may protect the glass 650 from an impact from the first direction (the +Z axis direction). The protection layer 660 may have a second strength. The second strength may be lower than the first strength. The protection layer 660 may include a nonmetallic material, plastic, and/or a polymeric material that is flexible. For example, the protection layer 660 may include polyimide.

In an embodiment, a thickness of the glass 650 in the first direction (the +Z axis direction) may be set such that the display 210 may be folded or unfolded a plurality of times. As the thickness of the glass 650 in the first direction (the +Z axis direction) decreases, an edge of the glass may be cracked or chipped. It may be inspected whether the edge of the glass in the first direction (the +Z axis direction) corresponding to the front side of the display 210 is cracked or chipped.

In an embodiment, the first printing layer 601 may be disposed in the first direction (the +Z axis direction) of the glass 650. When the first direction (the +Z axis direction) faces the upper side, the first printing layer 601 may be disposed on the glass 650. The first printing layer 601 may be disposed between the glass 650 and the protection layer 660. The first printing layer 601 may be printed on a lower side of the protection layer 660. Furthermore, the first printing layer 601 may be printed on the glass 650. The first printing layer 601 may include a material that shields light. The first printing layer 601 may be formed by depositing a black material or a colored material that shields light on a lower side of the protection layer 660 or an upper side of the glass 650. The first printing layer 601 may be formed by curing the material that shields light on the lower side of the protection layer 660 or the upper side of the glass 650 in a UV curing scheme.

In an embodiment, the first printing layer 601 may alleviate a phenomenon, in which at least a portion of the non-display area of the display panel 630 is viewed from the first direction (the +Z axis direction). For example, the first printing layer 601 may alleviate a phenomenon, in which a color is visually recognized at a lower portion of an area of the non-display area of the display panel 630, which is adjacent to the active area. For example, the first printing layer 601 may include a black matrix.

In an embodiment, the first printing layer 601 may be spaced apart from the edge of the glass 650 in the third direction (the −X axis direction). The third direction (the −X axis direction) may be a direction that faces the active area of the display panel 630. The first printing layer 601 may be spaced apart from the edge of the glass 650 in the third direction (the −X axis direction) by a first distance D1.

In an embodiment, the first distance D1 may be set such that it may be inspected whether the edge of the glass 650 is cracked or chipped, from the first direction (the +Z axis direction). The first distance D1 may be set such that an inspection area, in which the cracking or chipping that occurs at the edge of the glass 650 may be inspected using an inspection device disposed in the first direction (the +Z axis direction). For example, the first distance D1 may be 2 mm or less.

In an embodiment, the first distance D1 may be set to be larger than a distance, by which the edge of the bonding layer 640 is spaced apart from the edge of the display panel 630 in the third direction (the −X axis direction). The first printing layer 601 may be spaced apart from the bonding layer 640 in the third direction (the −X axis direction). When the first printing layer 601 is spaced apart from the bonding layer 640 in the third direction (the −X axis direction), the edge of the bonding layer 640 may be inspected from the first direction (the +Z axis direction). Accordingly, it may be inspected whether the edge of the bonding layer 640 has a defect such as bubbles.

In an embodiment, the second printing layer 602 may be disposed in the second direction (the −Z axis direction) of the glass 650. When the first direction (the +Z axis direction) faces the upper side, the second printing layer 602 may be disposed under the glass 650.

In an embodiment, the second printing layer 602 may be disposed on the display panel 630. The second printing layer 602 may be disposed between the display panel 630 and the bonding layer 640. The second printing layer 602 may include a material that shields light.

In an embodiment, one end of the second printing layer 602 may correspond to the edge of the display panel 630. The second printing layer 602 may be disposed in an area of the non-display area of the display panel 630, except for an area in which the first printing layer 601 is disposed. The second printing layer 602 may alleviate a phenomenon, in which the area of the non-display area of the display panel 630, except for an area in which the first printing layer 601 is disposed, is visually recognized from the first direction (the +Z axis direction). For example, the second printing layer 602 may alleviate a phenomenon, in which an area of an outermost area of the non-display area of the display panel 630, in which there is no wiring line, is visually recognized as another color (e.g., a yellow color) that is different from the color of the first printing layer 601.

In an embodiment, when viewed from the first direction (the +Z axis direction), the first printing layer 601 and the second printing layer 602 may at least partially overlap each other. Accordingly, a phenomenon, in which the non-display area of the display panel 630 is visually recognized, may be further alleviated. When viewed from the first direction (the +Z axis direction), the first printing layer 601 and the second printing layer 602 may overlap each other by a second distance D2. The second distance D2 may be set in consideration of an internal structure of the non-display area of the display panel 630 in the first printing layer 601 and the second printing layer 602 and/or a degree, by which a light leakage phenomenon is visually recognized. The second distance D2 may be set in consideration of a disposition design error of the first printing layer 601 and the second printing layer 602.

Figure 7:
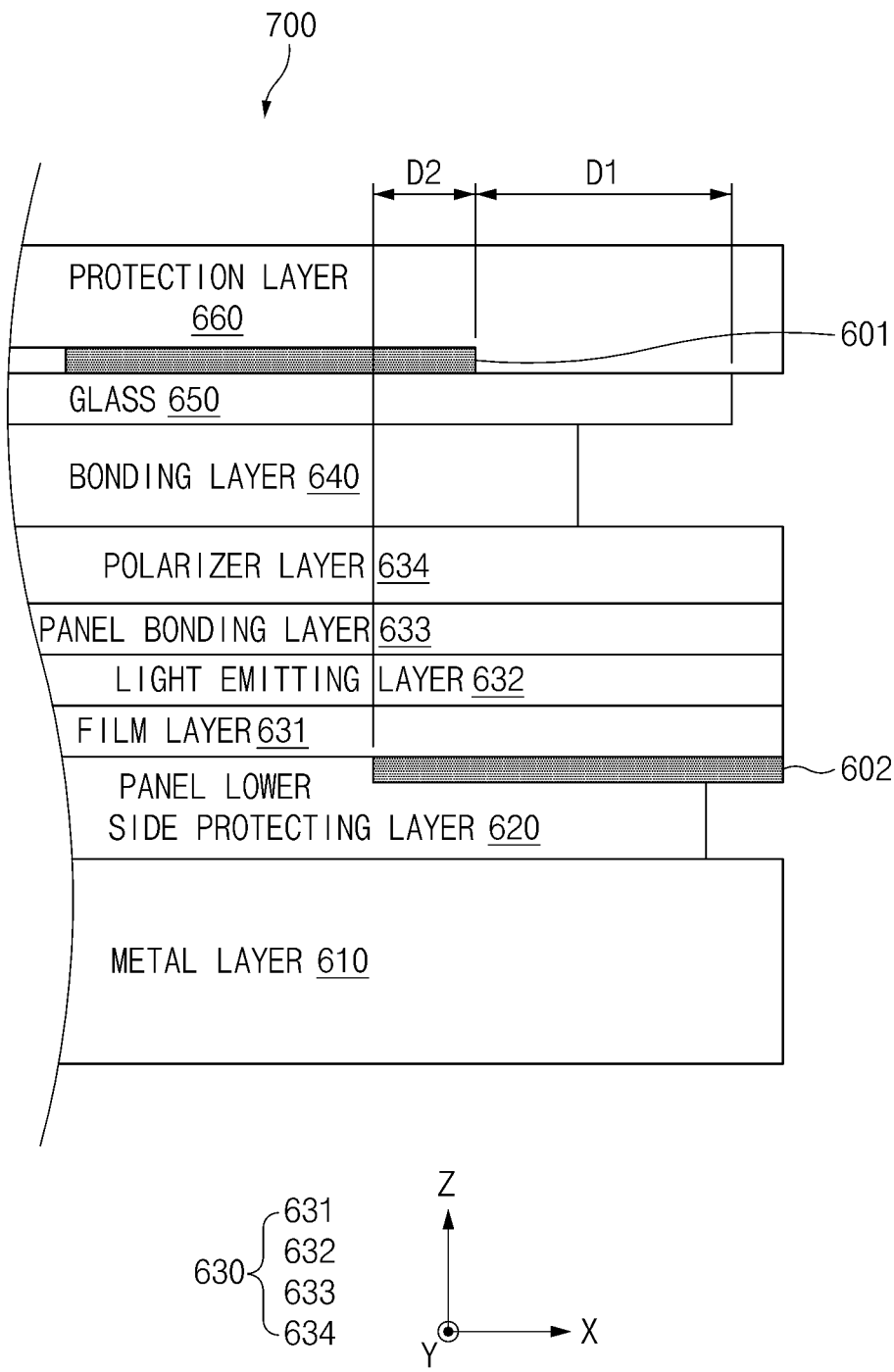
FIG. 7 is a side view of a display of an electronic device according to various embodiments.

FIG. 7 is a sectional side view 700 of a display (e.g., the display 210 of FIGS. 2 to 5) of an electronic device (e.g., the electronic device 101 of FIGS. 1 and 3 to 5) according to various embodiments. The metal layer 610, the panel lower side protecting layer 620, the display panel 630, the bonding layer 640, the glass 650, the protection layer 660, and the first printing layer 601 of the display 210 of FIG. 7 may be substantially the same as or similar to the metal layer 610, the panel lower side protecting layer 620, the display panel 630, the bonding layer 640, the glass 650, the protection layer 660, and the first printing layer 601 of the display 210 of FIG. 6.

In an embodiment, the second printing layer 602 may be disposed in the second direction (the −Z axis direction) of the display panel 630. When the first direction (the +Z axis direction) faces the upper side, the second printing layer 602 may be disposed under the display panel 630. The second printing layer 602 may be disposed between the display panel 630 and the panel lower side protecting layer 620.

FIG. 8 is a sectional side view 800 of a display (e.g., the display 210 of FIGS. 2 to 5) of an electronic device (e.g., the electronic device 101 of FIGS. 1 and 3 to 5) according to various embodiments. The metal layer 610, the panel lower side protecting layer 620, the bonding layer 640, the glass 650, the protection layer 660, and the first printing layer 601 of the display 210 of FIG. 8 may be substantially the same as or similar to the metal layer 610, the panel lower side protecting layer 620, the bonding layer 640, the glass 650, the protection layer 660, and the first printing layer 601 of the display 210 of FIG. 6.

In an embodiment, the panel bonding layer 633 may include the black bonding layer 635. An edge of the black bonding layer 635 may correspond to edges of the film layer 631, the light emitting layer 632, and the polarizer layer 634. The black bonding layer 635 may include a material that shields light. The black bonding layer 635 may couple the light emitting layer 632 and the polarizer layer 634.

In an embodiment, the black bonding layer 635 may be disposed in an area of the non-display area of the display panel 630, except for an area in which the first printing layer 601 is disposed. The black bonding layer 635 may alleviate a phenomenon, in which the area of the non-display area of the display panel 630, except for an area in which the first printing layer 601 is disposed, is visually recognized from the first direction (the +Z axis direction). For example, the black bonding layer 635 may alleviate a phenomenon, in which an area of an outermost area of the non-display area of the display panel 630, in which there is no wiring line, is visually recognized as another color (e.g., a yellow color) that is different from the color of the first printing layer 601. The black bonding layer 635 may perform substantially the same function as that of the second printing layer 602 of FIG. 6. Accordingly, the second printing layer 602 may be replaced by the black bonding layer 635 disposed in an interior of the display panel 630. When the second printing layer 602 is replaced by the black bonding layer 635 disposed in the interior of the display panel 630, a process of separately printing the second printing layer 602 may be omitted.

In an embodiment, when viewed from the first direction (the +Z axis direction), the first printing layer 601 and the black bonding layer 635 may at least partially overlap each other. Accordingly, a phenomenon, in which the non-display area of the display panel 630 is visually recognized, may be further alleviated. When viewed from the first direction (the +Z axis direction), the first printing layer 601 and the black bonding layer 635 may overlap each other by the second distance D2. The second distance D2 may be set in consideration of a design error of the first printing layer 601 and the black bonding layer 635 and/or a degree, by which the non-display area of the display panel 630 is visually recognized.

Figure 9:
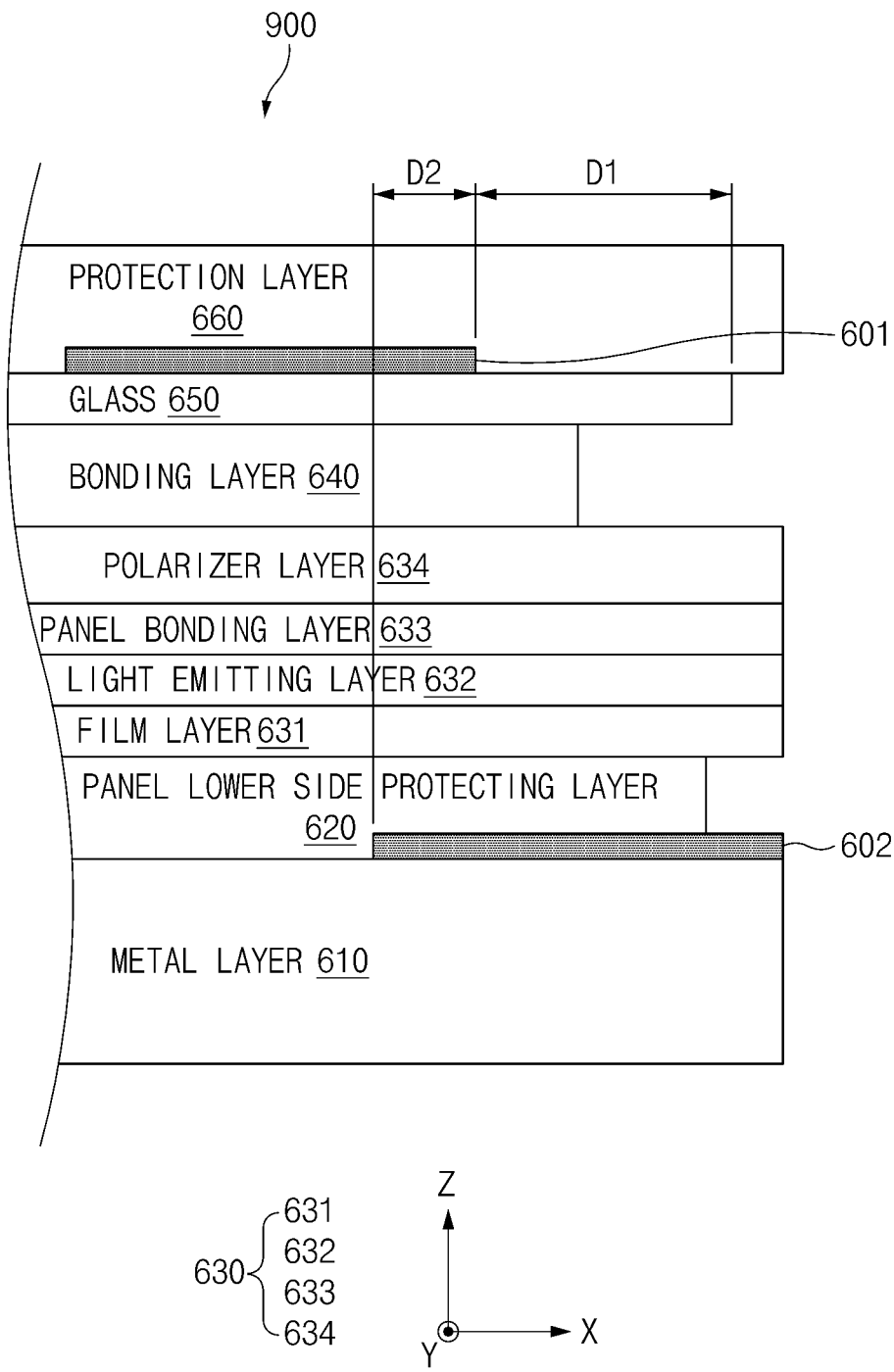
FIG. 9 is a side view of a display of an electronic device according to various embodiments.

FIG. 9 is a sectional side view 900 of a display (e.g., the display 210 of FIGS. 2 to 5) of an electronic device (e.g., the electronic device 101 of FIGS. 1 and 3 to 5) according to various embodiments. The metal layer 610, the panel lower side protecting layer 620, the display panel 630, the bonding layer 640, the glass 650, the protection layer 660, and the first printing layer 601 of the display 210 of FIG. 9 may be substantially the same as or similar to the metal layer 610, the panel lower side protecting layer 620, the display panel 630, the bonding layer 640, the glass 650, the protection layer 660, and the first printing layer 601 of the display 210 of FIG. 6.

In an embodiment, the second printing layer 602 may be disposed between the metal layer 610 and the panel lower side protecting layer 620. The second printing layer 602 may be disposed in the first direction (the +Z axis direction) of the metal layer 610. One end of the second printing layer 602 may correspond to an edge of the metal layer 610.

Figure 10:
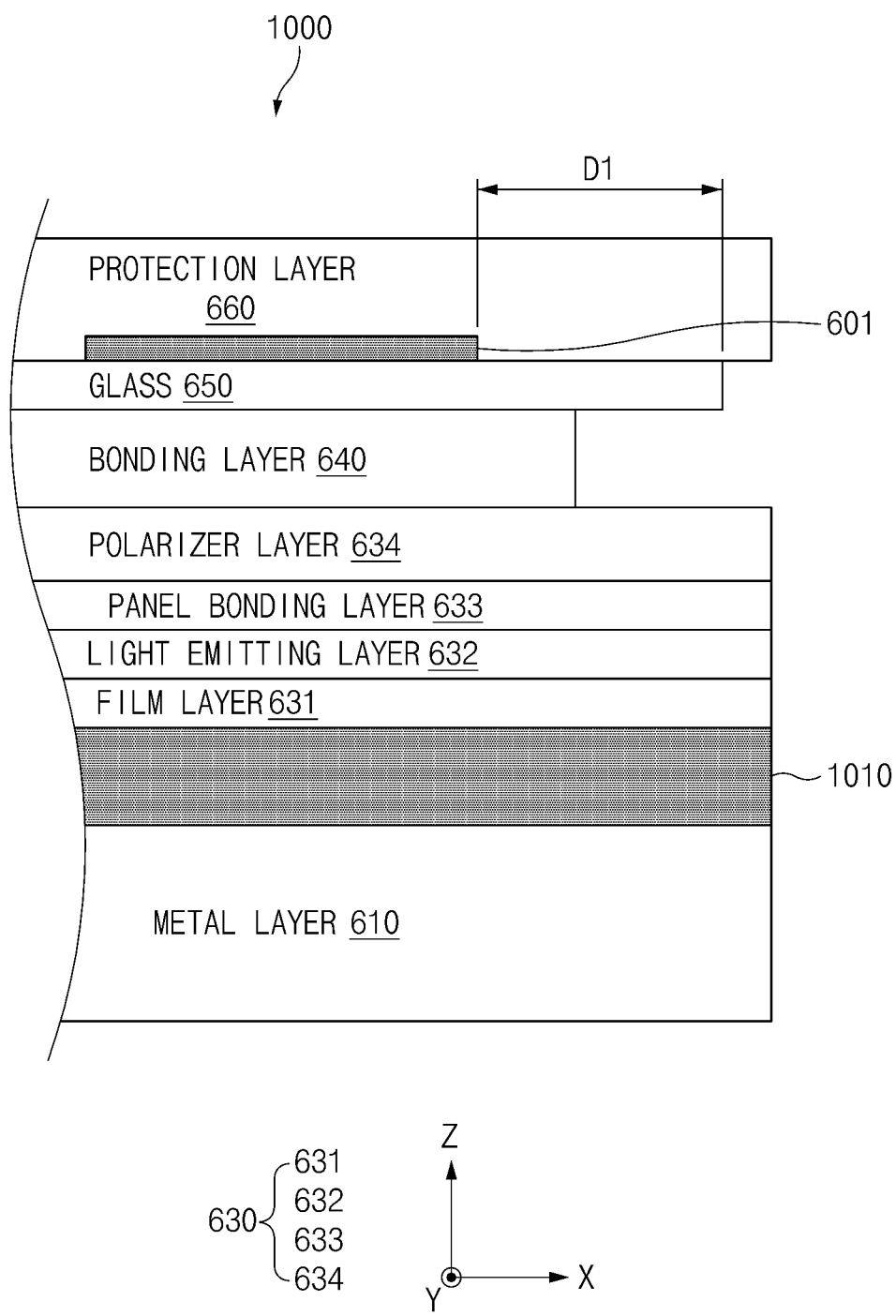
FIG. 10 is a side view of a display of an electronic device according to various embodiments.

FIG. 10 is a sectional side view 1000 of a display (e.g., the display 210 of FIGS. 2 to 5) of an electronic device (e.g., the electronic device 101 of FIGS. 1 and 3 to 5) according to various embodiments. The metal layer 610, the display panel 630, the bonding layer 640, the glass 650, the protection layer 660, and the first printing layer 601 of the display 210 of FIG. 10 may be substantially the same as or similar to the metal layer 610, the display panel 630, the bonding layer 640, the glass 650, the protection layer 660, and the first printing layer 601 of the display 210 of FIG. 6.

In an embodiment, a black panel lower side protecting layer 1010 may be disposed in the first direction (the +Z axis direction) of the metal layer 610. The black panel lower side protecting layer 1010 may be disposed in the second direction (the −Z axis direction) of the display panel 630. The black panel lower side protecting layer 1010 may be disposed between the metal layer 610 and the display panel 630. The black panel lower side protecting layer 1010 may include a material that shields light. The black panel lower side protecting layer 1010 may perform substantially the same function as that of the second printing layer 602 of FIG. 6. Accordingly, the second printing layer 602 may be replaced by the black panel lower side protecting layer 1010 disposed under the display panel 630. When the second printing layer 602 is replaced by the black panel lower side protecting layer 1010 disposed in the interior of the display panel 630, a process of separately printing the second printing layer 602 may be omitted.

In an embodiment, an edge of the black panel lower side protecting layer 1010 may correspond to an edge of the display panel 630. The black panel lower side protecting layer 1010 and the display panel 630 may be manufactured in one-to-one cutting scheme. The black panel lower side protecting layer 1010 and the display panel 630 may be cut at once. Accordingly, the black panel lower side protecting layer 1010 may be disposed such that the edge of the black panel lower side protecting layer 1010 and the edge of the display panel 630 correspond to each other.

Figure 11:
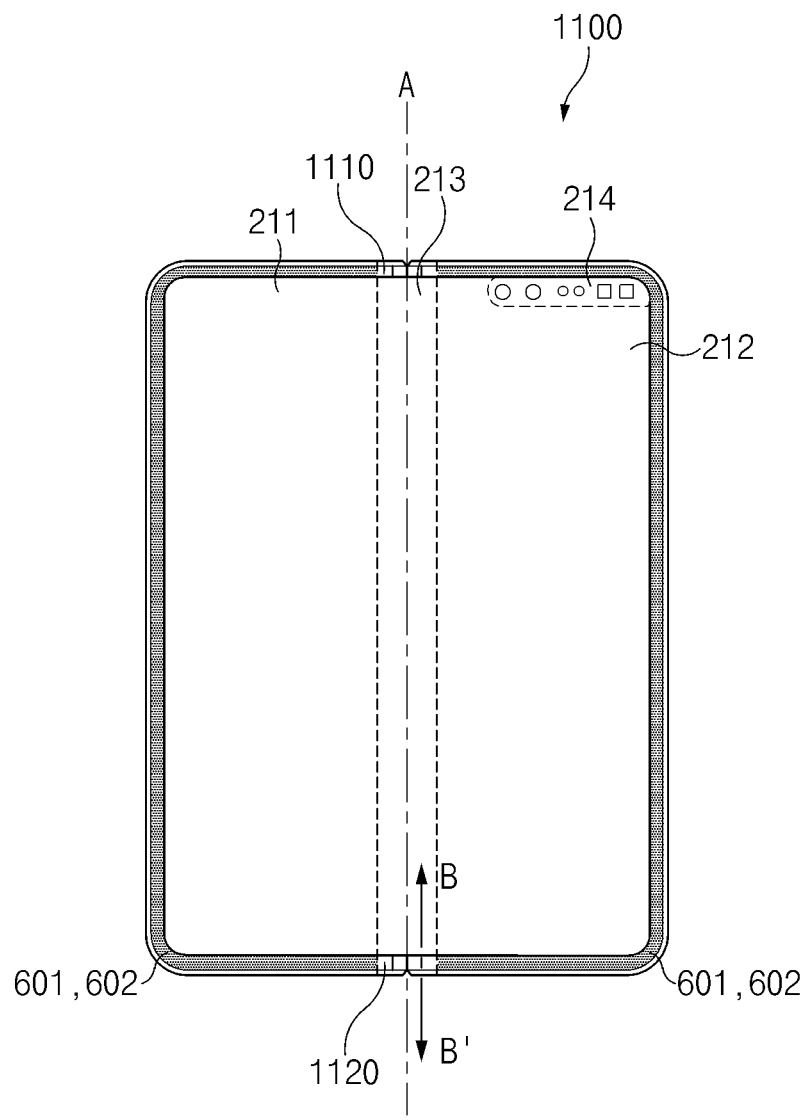
FIG. 11 is a front view of an electronic device according to various embodiments.
Figure 12:
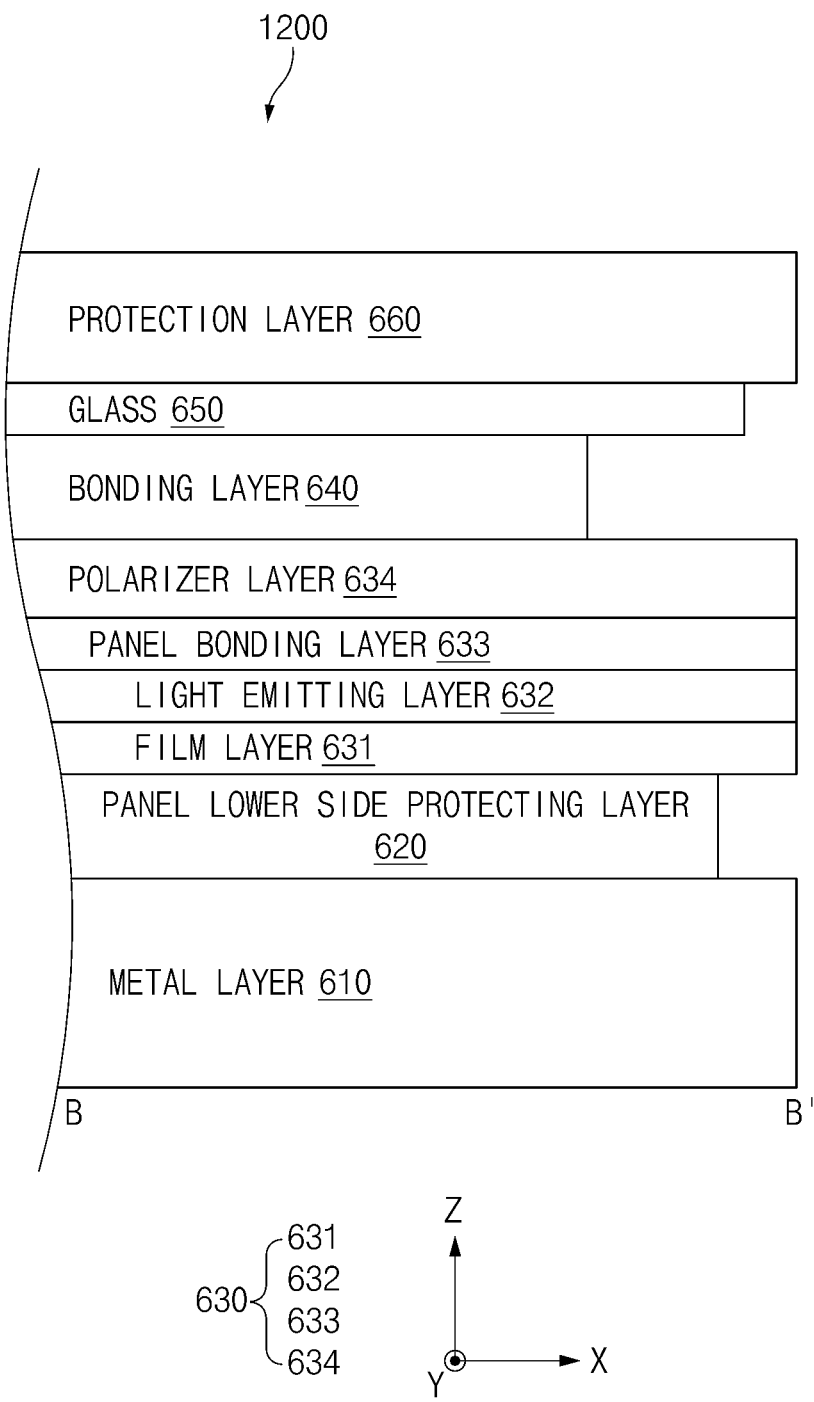
FIG. 12 is a cross-sectional view of an electronic device, taken along line B-B', according to various embodiments.

FIG. 11 is a front view 1100 of a foldable electronic device (e.g., the electronic device 101 of FIG. 1 and FIGS. 3 to 5) according to various embodiments. FIG. 12 is a cross-sectional view 1200 of the electronic device (e.g., the electronic device 101 of FIG. 1 and FIGS. 3 to 5) according to various embodiments, taken along line B-B' of FIG. 11. The metal layer 610, the panel lower side protecting layer 620, the display panel 630, the bonding layer 640, the glass 650, and the protection layer 660 of the display 210 of FIG. 12 may be substantially the same as or similar to the metal layer 610, the panel lower side protecting layer 620, the display panel 630, the bonding layer 640, the glass 650, and the protection layer 660 of the display 210 of FIG. 6.

In an embodiment, the display 210 of the electronic device 101 may include the first area 211, the second area 212, the folding area 213, and the sensor area 214. The display 210 may be surrounded by the first front housing (e.g., the first front housing 310 of FIG. 3) and the second front housing (e.g., the second front housing 320 of FIG. 3).

In an embodiment, the first printing layer (e.g., the first printing layer 601 of FIGS. 6 to 10) and the second printing layer (e.g., the second printing layer 602 of FIG. 6, FIG. 7, and/or FIG. 9) may be disposed in an area of the display 210, which is adjacent to the first front housing 310 and the second front housing 320.

In an embodiment, a first edge 1110 and a second edge 1120 may be formed in the folding area 213 of the display 210, which is adjacent to the first front housing 310 and the second front housing 320. The first edge 1110 and the second edge 1120 may be repeatedly folded and unfolded. A possibility of the first edge 1110 and the second edge 1120 being cracked or chipped may be increased. It may be inspected whether the first edge 1110 and the second edge 1120 is cracked or chipped.

In an embodiment, neither the first printing layer 601 nor the second printing layer 602 may be disposed at the first edge 1110 and the second edge 1120. The first printing layer 601 and the second printing layer 602 may be disposed in an area, except for, the first edge 1110 and the second edge 1120 that overlap the folding area 213, in which the display panel 630 is folded or unfolded. When neither the first printing layer 601 nor the second printing layer 602 is disposed in the first edge 1110 and the second edge 1120, it may be more easily inspected whether the first edge 1110 and the second edge 1120 are cracked or chipped.

Figure 13:
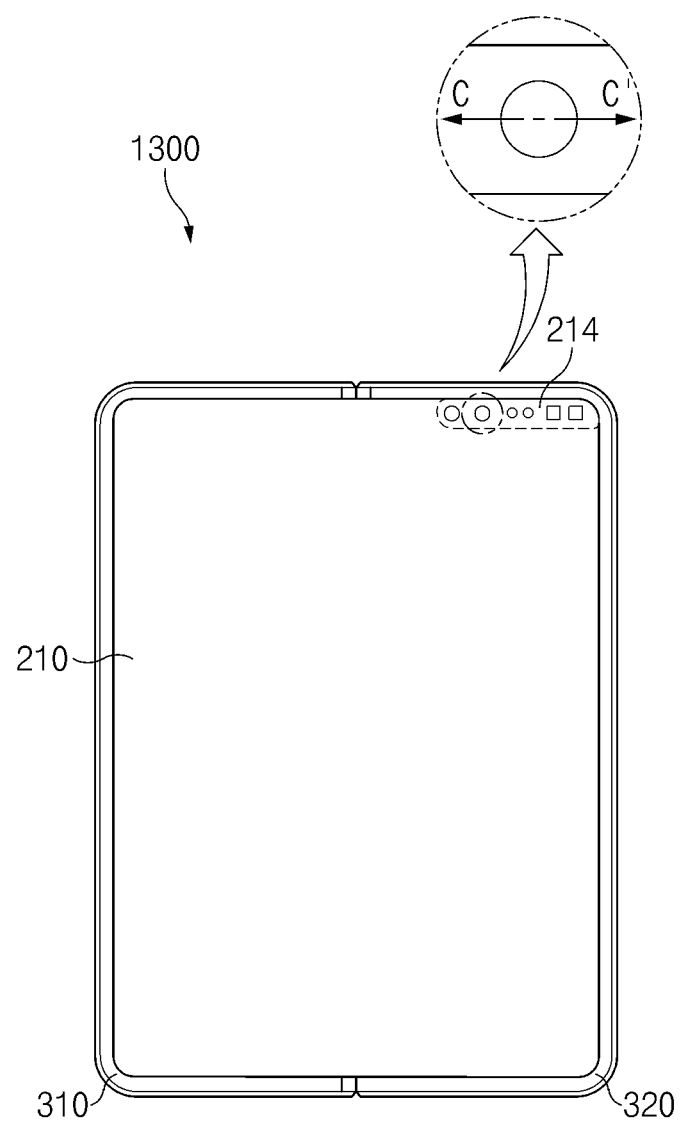
FIG. 13 is a front view of an electronic device according to various embodiments.

FIG. 13 is a front view 1300 of a foldable electronic device (e.g., the electronic device 101 of FIG. 1 and FIGS. 3 to 5) according to various embodiments.

In an embodiment, the display 210 of the electronic device 101 may include the sensor area 214. The display 210 may be surrounded by the first front housing 310 and the second front housing 320.

In an embodiment, an opening may be provided in the sensor area 214. For example, a hole such as a front camera hole and/or a sensor hole may be provided in the sensor area 214 in the first direction (the +Z axis direction). The sensor area 214 may maintained a fixed state while not being folded or unfolded. A possibility of the glass 650 being cracked or chipped may be alleviated in the opening provided in the sensor area 214.

Figure 14:
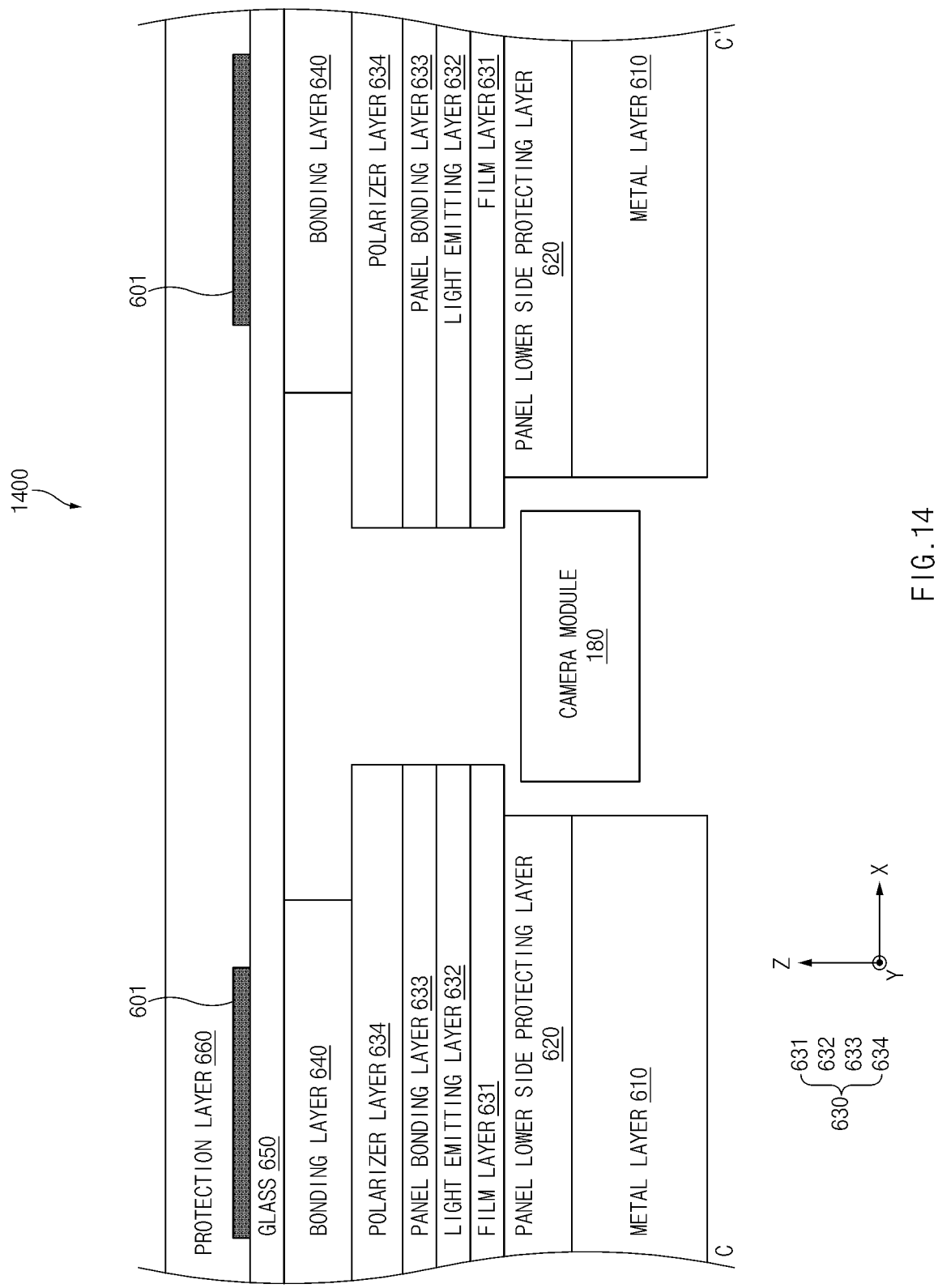
FIG. 14 is a cross-sectional view of an electronic device, taken along line C-C', according to various embodiments.

FIG. 14 is a cross-sectional view of the electronic device (e.g., the electronic device 101 of FIG. 1 and FIGS. 3 to 5) according to various embodiments, taken along line C-C' of FIG. 13. The metal layer 610, the panel lower side protecting layer 620, the display panel 630, the bonding layer 640, the glass 650, the protection layer 660, and the first printing layer 601 of FIG. 14 may be substantially the same as or similar to the metal layer 610, the panel lower side protecting layer 620, the display panel 630, the bonding layer 640, the glass 650, the protection layer 660, and the first printing layer 601 of the display 210 of FIG. 6.

In an embodiment, the second printing layer (e.g., the second printing layer 602 of FIG. 6, FIG. 7, and/or FIG. 9) may not be disposed in the sensor area 214. The first printing layer 601 and the second printing layer 602 may be disposed in an area of the edge of the display panel 630, except for the sensor area 214. When the second printing layer 602 is not disposed in the sensor area 214, a separate process for disposing the second printing layer 602 in the sensor area 214 may be omitted.

Figure 15:
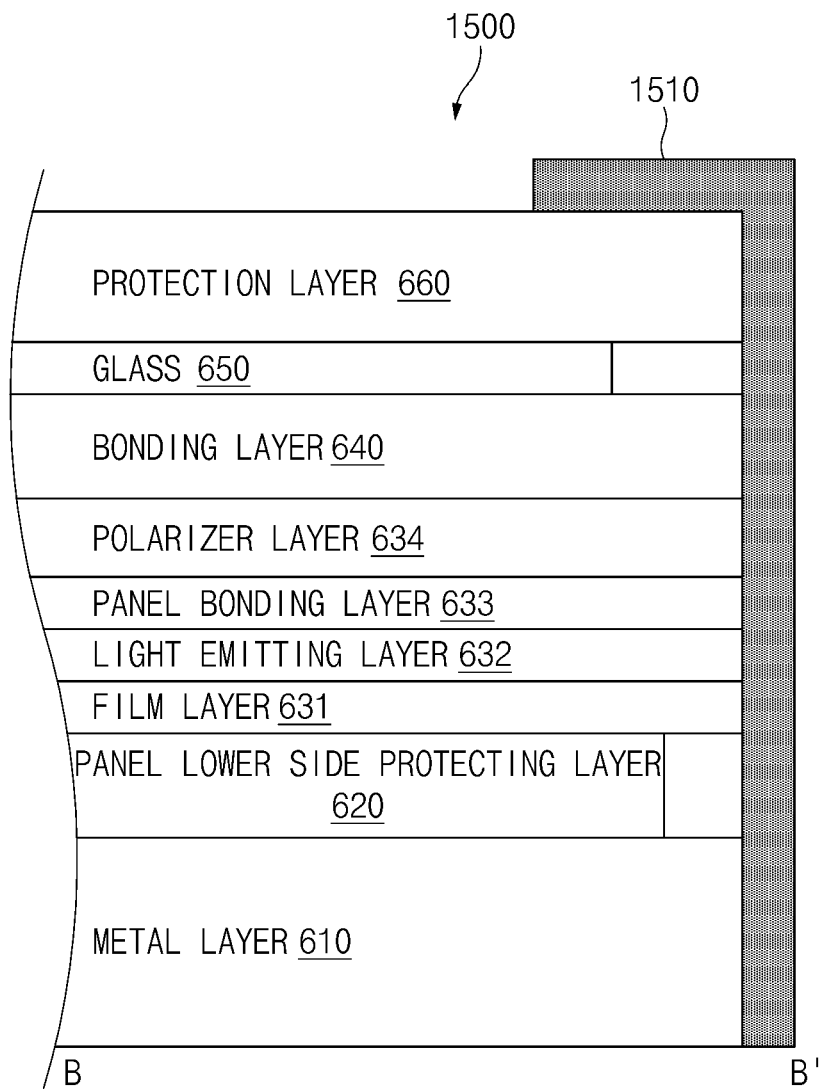
FIG. 15 is a cross-sectional view of an electronic device, taken along line B-B', according to various embodiments.

FIG. 15 is a cross-sectional view of the electronic device (e.g., the electronic device 101 of FIG. 1 and FIGS. 3 to 5) according to various embodiments, taken along line B-B' of FIG. 11. The metal layer 610, the panel lower side protecting layer 620, the display panel 630, the bonding layer 640, the glass 650, and the protection layer 660 of FIG. 15 may be substantially the same as or similar to the metal layer 610, the panel lower side protecting layer 620, the display panel 630, the bonding layer 640, the glass 650, and the protection layer 660 of the display 210 of FIG. 6.

In an embodiment, a shielding member 1510 may be disposed in the first edge (e.g., the first edge 1110 of FIG. 11) and the second edge (e.g., the second edge 1120 of FIG. 11). The shielding member 1510 may be disposed to surround edges of the metal layer 610, the panel lower side protecting layer 620, the display panel 630, the bonding layer 640, the glass 650, and the protection layer 660. The shielding member 1510 may be a decorative member. The shielding member 1510 may include a material that shields light. The shielding member 1510 may alleviate a phenomenon, in which interiors of the first edge 1110 and the second edge 1120 are visually recognized.

Figure 16A:
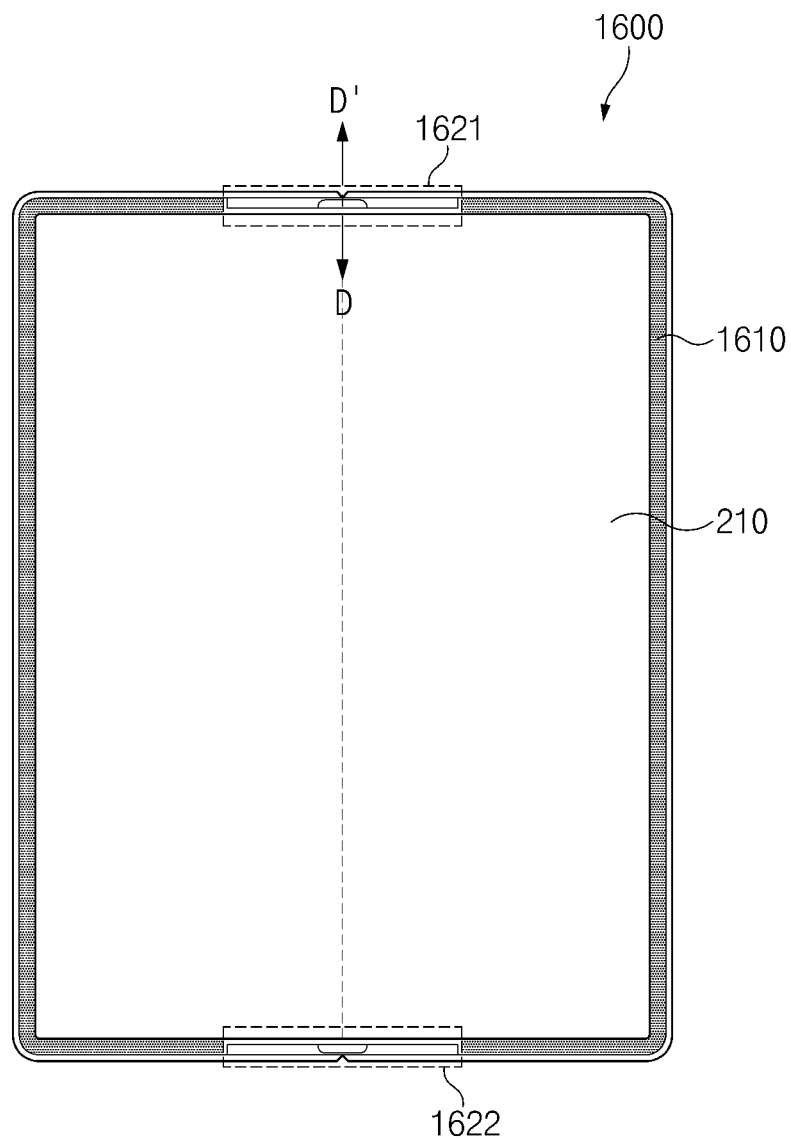
FIG. 16A is a front view of an electronic device according to various embodiments.
Figure 16B:
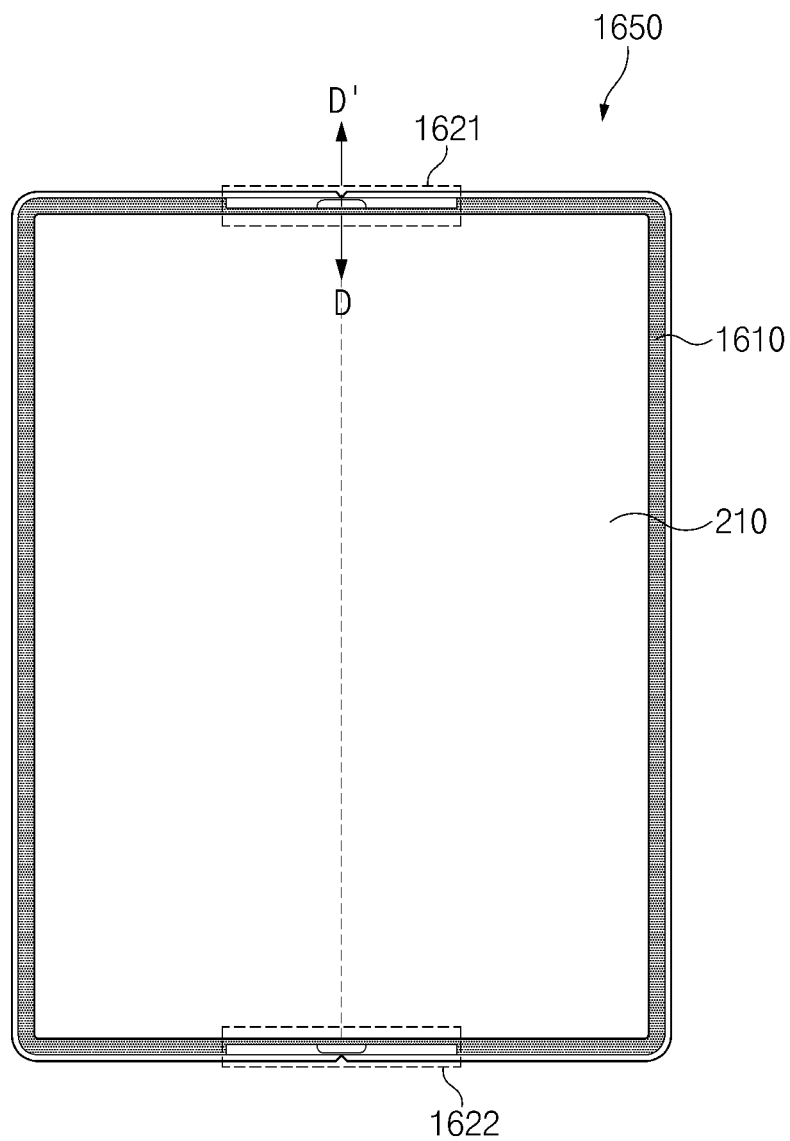
FIG. 16B is a front view of an electronic device according to various embodiments.
Figure 17:
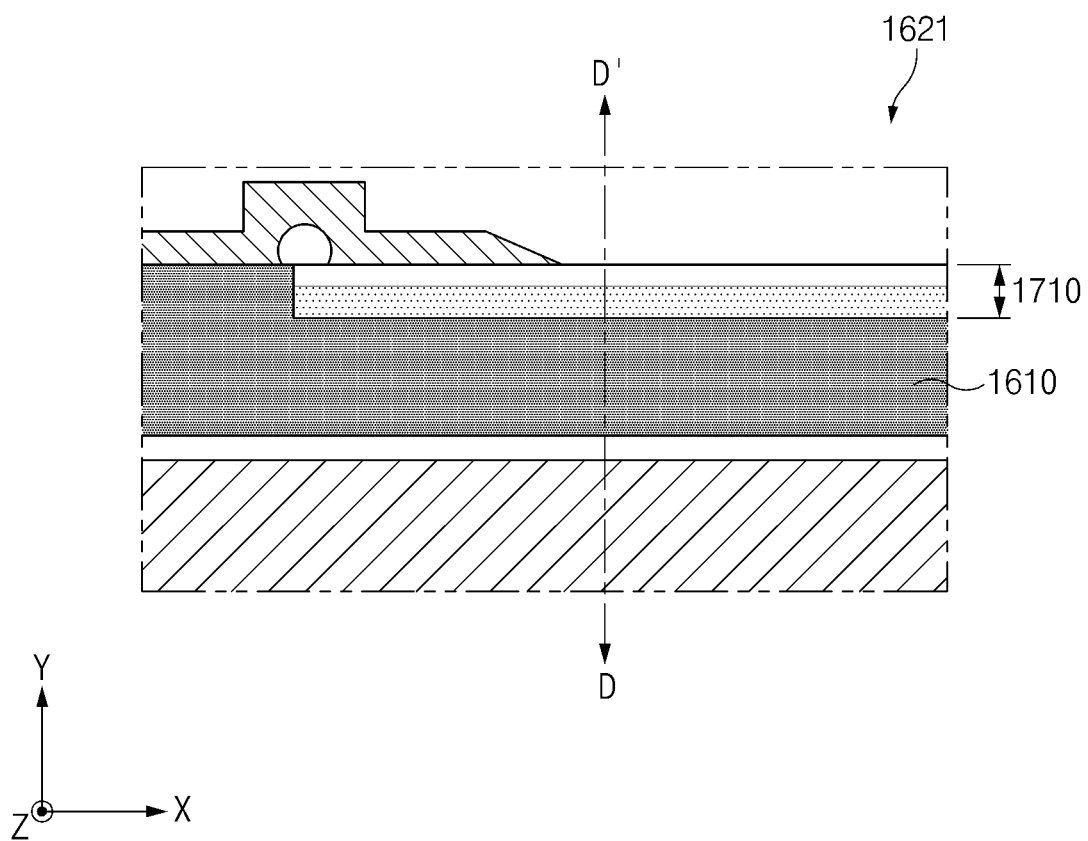
FIG. 17 is a front view of a first inspection area of an electronic device according to various embodiments.
Figure 18:
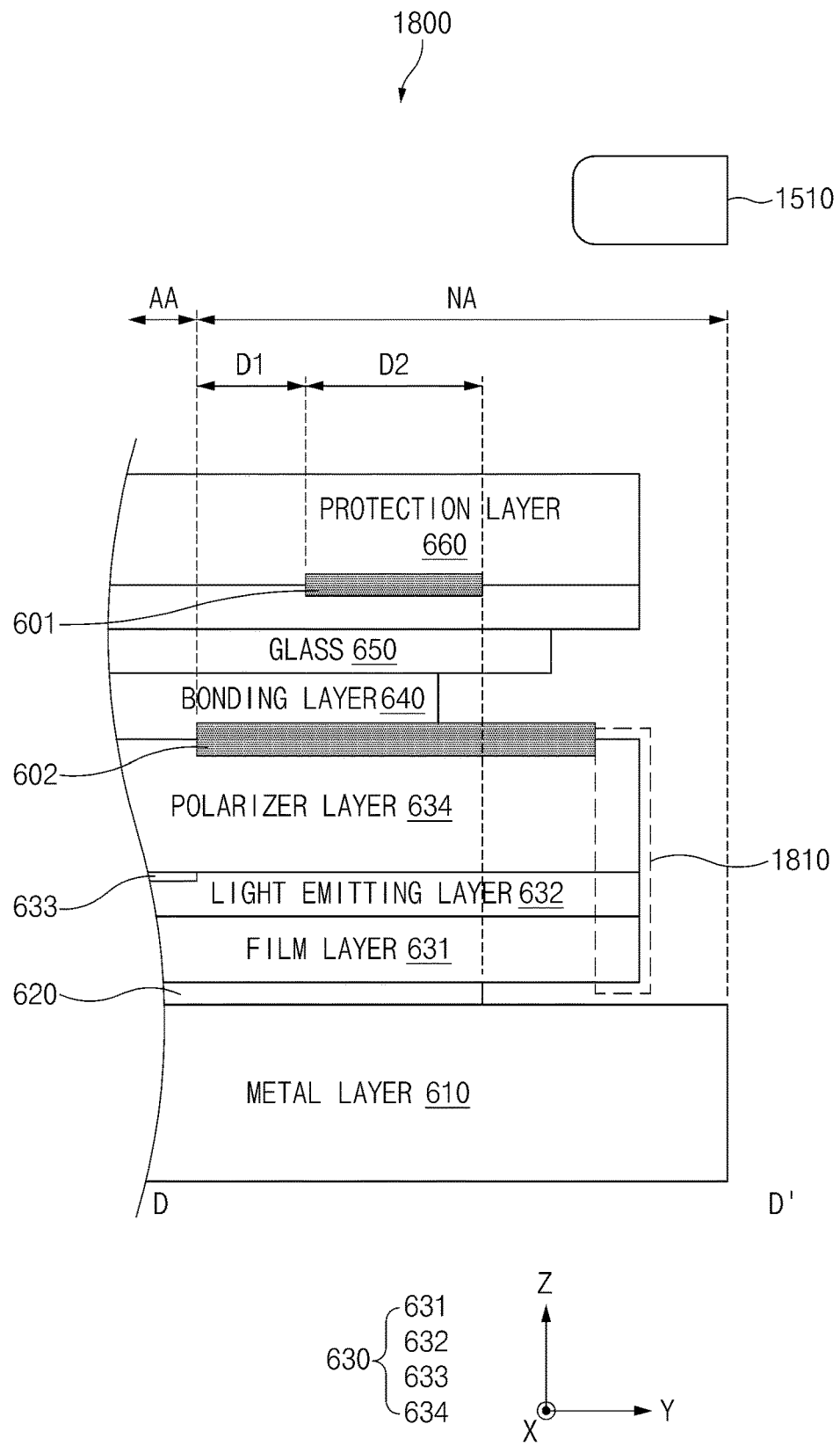
FIG. 18 is a cross-sectional view taken along line D-D' of FIG. 17 various embodiments.

FIG. 16A is a front view 1600 of a foldable electronic device 101 according to various embodiments. FIG. 16B is a front view 1650 of the electronic device 101 according to various embodiments. FIG. 17 is a front view of a first inspection area 1621 of the electronic device 101 according to various embodiments. FIG. 18 is a cross-sectional view 1800 taken along line D-D' of FIG. 17 according to various embodiments. The metal layer 610, the panel lower side protecting layer 620, the display panel 630, the bonding layer 640, the glass 650, and the protection layer 660 of FIG. 18 may be substantially the same as or similar to the metal layer 610, the panel lower side protecting layer 620, the display panel 630, the bonding layer 640, the glass 650, and the protection layer 660 of the display 210 of FIG. 6. A decoration 1510 of FIG. 18 may be substantially the same as a decoration 1510 of FIG. 15.

In an embodiment, a printing layer 1610 may be disposed to surround the display 210 of the electronic device 101. The printing layer may include the first printing layer 601 and the second printing layer 602.

In an embodiment, an inspection area 1620 may be formed at an outskirt portion of the printing layer 1610 disposed at an outskirt of the display 210, which contacts the folding area (e.g., the folding area 213 of FIG. 11). The inspection area 1620 may include a first inspection area 1621 and a second inspection area 1622.

In an embodiment, as illustrated in FIG. 16A, the printing layer 1610 may not be printed in the inspection area 1620. The printing layer 1610 may be removed from the inspection area 1620. The inspection area 1620 may be an inspection area of a glass (e.g., the glass 650 of FIG. 6) such as UTG. Accordingly, printing of the folding part, in which a crack is concentrated, may be removed.

In an embodiment, as illustrated in FIG. 16B, the printing layer 1610 disposed in the inspection area 1620 may have a width that is smaller than that of the printing layer 1610 of the remaining parts. At least a portion of the printing layer 1610 disposed in the inspection area 1620 may be cut. For example, at least a portion of the printing layer 1610 may be cut such that the printing layer 1610 disposed in the inspection area 1620 does not overlap a mechanism disposed at an upper center and a lower center of the display 210. Printing of only the folding part may be offset by cutting a portion of the printing layer 1610. Accordingly, a structure for inspecting the glass 650, such as UTG, of the edge part may be implemented.

In an embodiment, the printing layer 1610 may be disposed at an outskirt of the display 210 such that printing characteristics thereof are different for respective areas. The inspection area 1620 may be an area, in which the printing layer is printed, such that an offset is provided to the folding part (e.g., the folding area 213) in which a crack is concentrated. The inspection area 1620 may be an area for inspecting the glass 650, such as UTG.

In an embodiment, the inspection area 1620 may be an area including the folding part. The inspection area 1620 may be disposed to be closer to an active area AA than an area, to which an offset is not applied to the printing layer 1610. The inspection area 1620 may have a cutoff portion 1710, at which the printing layer 1610 is deleted.

In an embodiment, carbon fiber reinforced plastic (CFRP) may be visually recognized at a first edge 1810 of the display panel 630.

Figure 19A:
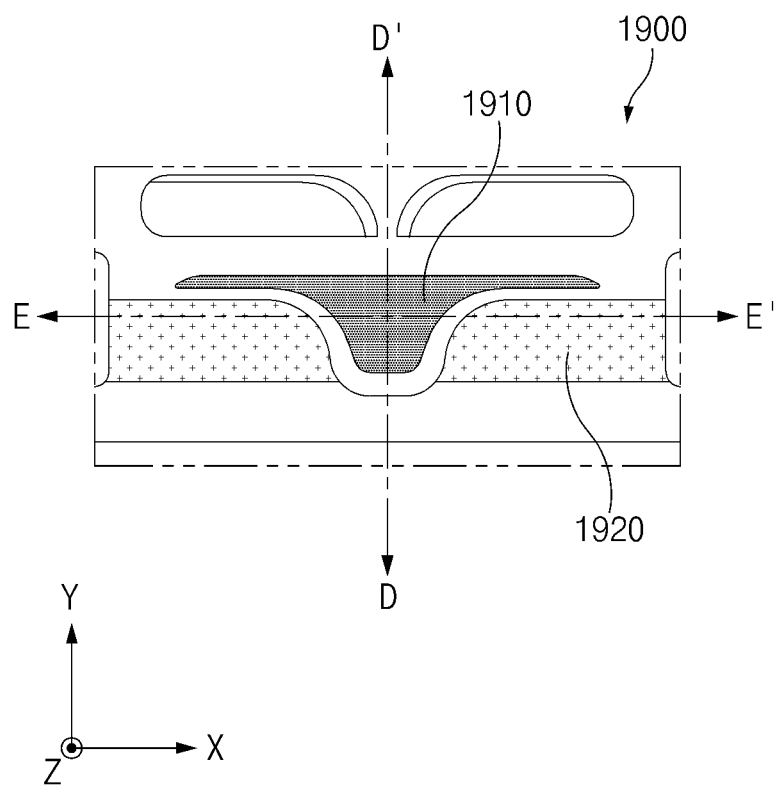
FIG. 19A is a front view of a mechanism part of an electronic device according to various embodiments.
Figure 19B:
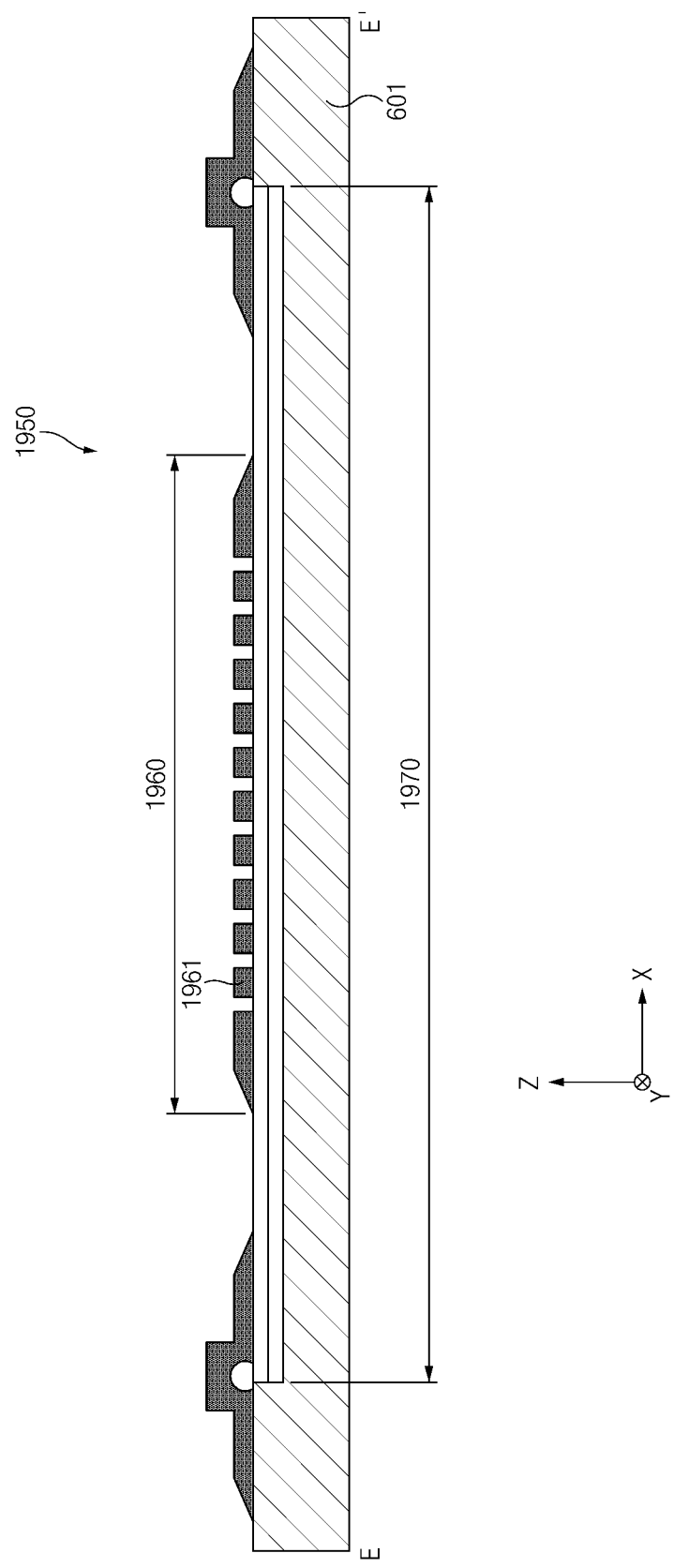
FIG. 19B is a cross-sectional view taken along line E-E' of FIG. 19A various embodiments.

FIG. 19A is a front view 1900 of a mechanism part of the electronic device 101 according to various embodiments. FIG. 19B is a cross-sectional view 1950 taken along line E-E' of FIG. 19A according to various embodiments.

In an embodiment, an upper central area and a lower central area of the electronic device 101 may include a mechanism part. The mechanism part may be an area, in which mechanisms of the electronic device 101 are disposed at an upper center and a lower center of the electronic device. For example, the mechanism part may be an area, in which a receiver and a microphone of the electronic device 101 are disposed.

In an embodiment, the mechanism part may include a capacitor area 1910 and a cover member 1920. The capacitor area 1910 may include a projected capacitive (P-CAP) element. The cover member 1920 may include a dust cover that interrupts foreign substances such as dust.

Figure 16A:
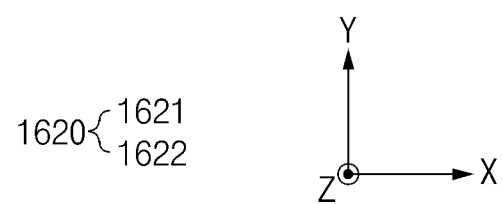

In an embodiment, the mechanism part may include an inspection area (e.g., the inspection area 1620 of FIG. 16). A cross-section of D-D' of the mechanism part including the inspection area 1620 may be substantially the same as or similar to a cross-section illustrated in FIG. 18.

In an embodiment, the mechanism part may include a lattice pattern area 1960. As illustrated in a cross-section of E-E' illustrated in FIG. 19B, the lattice pattern area 1960 may include a plurality of lattice patterns 1961. The plurality of lattice patterns 1961 included in the lattice pattern area 1960 may be patterns including the first printing layer 601.

In an embodiment, the mechanism part may include an area, in which the first printing layer 601 is offset. Lattice patterns 1961 may be disposed in the mechanism part along an area, in which the folding axis extends. The lattice pattern area 1960 of the mechanism part may be formed at a location corresponding to the capacitor area 1910 and the cover member 1920.

In an embodiment, in the mechanism part, an offset width 1970, by which the first printing layer 601 is offset, may be larger than a width of the lattice pattern area 1960. In the mechanism part, the first printing layer 601 may be removed wider in an area than the lattice pattern area 1960. Accordingly, in the mechanism part, the first printing layer 601 may not overlap the lattice pattern area 1960.

In an embodiment, the second printing layer (e.g., the second printing layer 602 of FIG. 18) may be disposed on the display panel 630, for example, on the polarizer layer 634. The second printing layer 602 may be visually recognized as a black state when viewed by the user in the +Z axis direction. The second printing layer 602 may be disposed in the non-active area (e.g., the non-active area NA of FIG. 18) at an outskirt of the active area (e.g., the active area AA of FIG. 18). The second printing layer 602 may not have a classification point such as an offset of the folding part and the other areas.

Figure 20A:
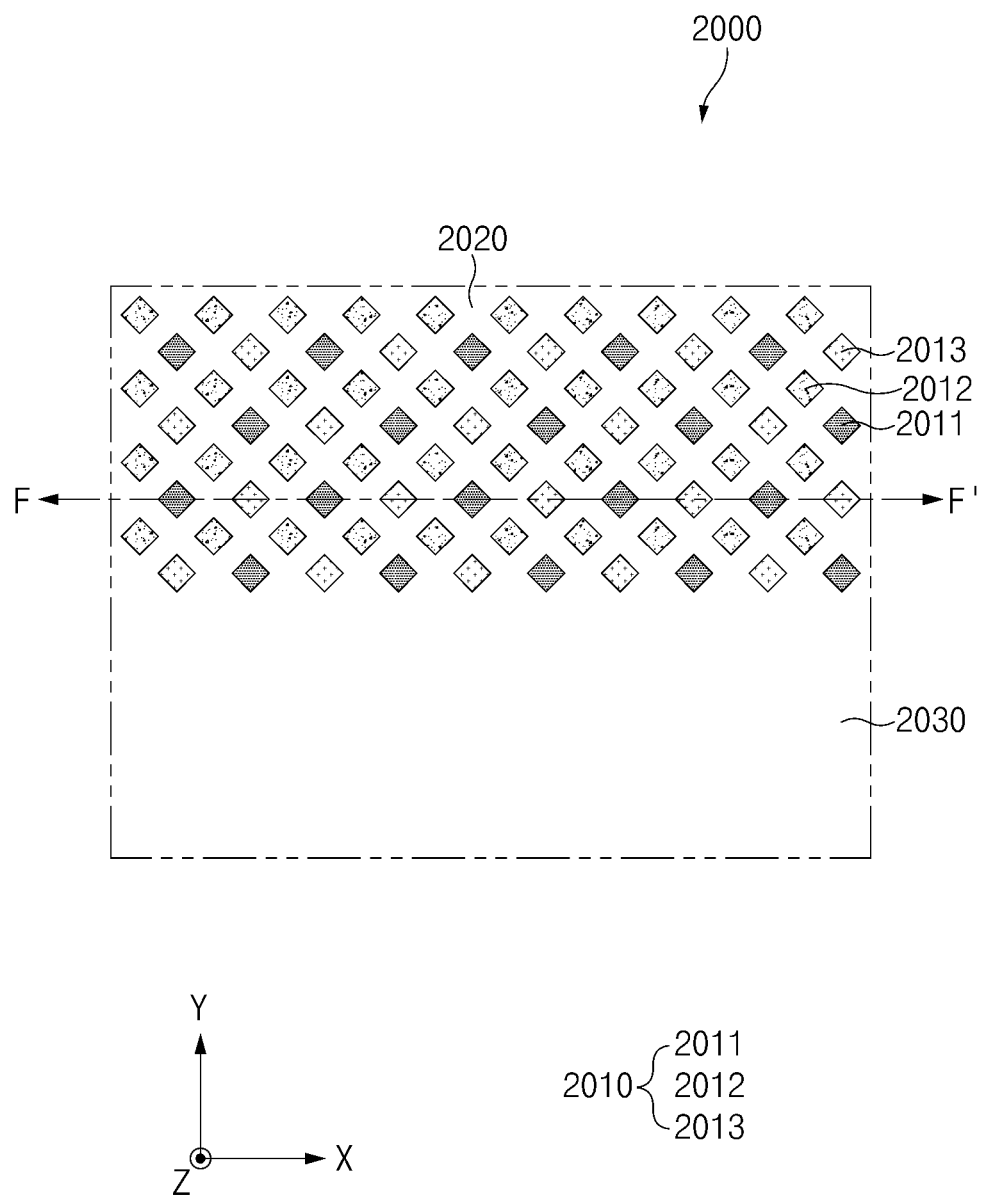
FIG. 20A is a front view of a second printing layer of an electronic device according to various embodiments.
Figure 20B:
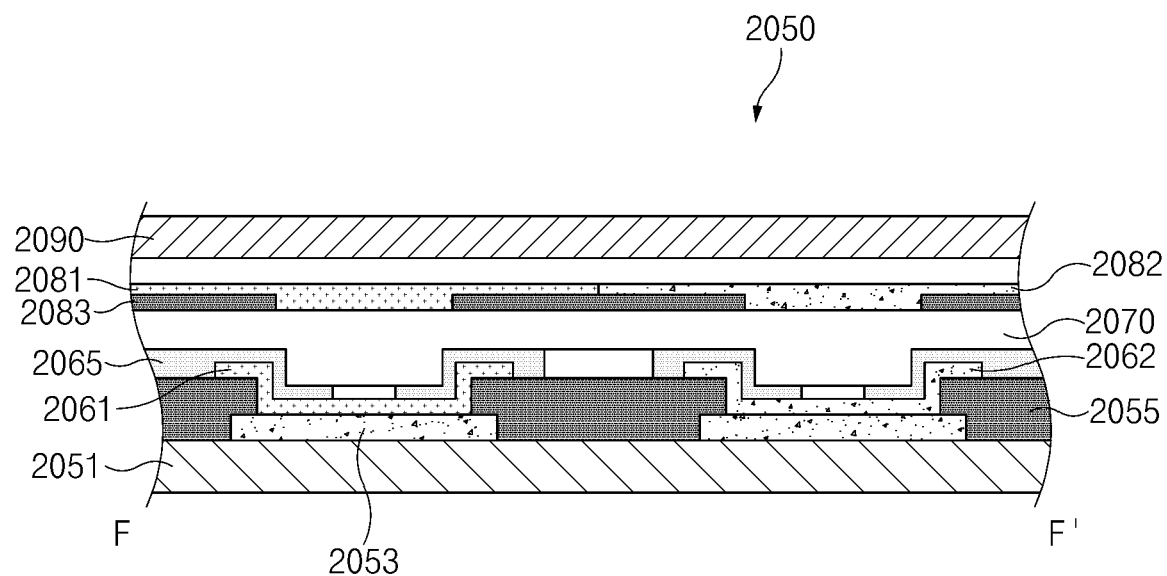
FIG. 20B is a cross-sectional view taken along line F-F' of FIG. 20A various embodiments.

FIG. 20A is a front view 2000 of a second printing layer (e.g., the second printing layer 602 of FIG. 17) of the electronic device 101 according to various embodiments. FIG. 20B is a cross-sectional view 2050 taken along line F-F' of FIG. 20A according to various embodiments.

In an embodiment, a plurality of pixels 2010 may be disposed at portions of the electronic device 101, at which the second printing layer 602 is disposed. The plurality of pixels 2010 may include red sub-pixels 2011, green sub-pixels 2012, and blue sub-pixels 2013.

In an embodiment, a first black matrix (BM) 2020 may be disposed at the portions, at which the plurality of pixels 2010 are disposed. The first black matrix 2020 may be disposed between the plurality of pixels 2010. The plurality of pixels 2010 may be classified by the first black matrix 2020.

In an embodiment, a second black matrix 2030 may be disposed at portions, except for the portions, at which the plurality of pixels 2010 are disposed. The second black matrix 2030 may be disposed between the plurality of pixels 2010.

In an embodiment, a lowermost layer of portion F-F' of FIG. 20A may be a transistor layer 2051. The transistor layer 2051 may include a low-temperature polycrystalline silicon (LTPS).

In an embodiment, an anode 2053 and a black pixel defining layer (black PDL) 2055 may be disposed on the transistor layer 2051. The anode 2053 may comprise a first electrode of a pixel (e.g., the pixel 2010 of FIG. 20A). The black pixel defining layer 2055 may classify the plurality of pixels 2010.

In an embodiment, an organic light emitting layer 2060 may be disposed on the anode 2053. The organic light emitting layer 2060 may include a first organic light emitting layer 2061 that emits light of a first color and a second organic light emitting layer 2062 that emits light of a second color.

In an embodiment, a cathode 2065 may cover an upper side of the black pixel defining layer 2055 and the organic light emitting layer 2060. The cathode 2065 may comprise a second electrode of the pixel 2010.

In an embodiment, a thin film encapsulation layer 2070 may cover an upper side of the cathode 2065. The thin film encapsulation layer 2070 may prevent and/or reduce foreign substances from penetrating into the pixel 2010.

In an embodiment, a color filter layer 2080 may be formed on the thin film encapsulation layer 2070. The color filter layer 2080 may include a first color filter 2081 that transmits the light of the first color and shields the light except for the light of the first color, a second color filter 2082 that transmits the light of the second color and shields the light except for the light of the second color, and a black matrix 2083.

In an embodiment, an upper cover 2090 may be disposed on the color filter layer 2080. The upper cover 2090 may be a polyimide (PI) window that is transparent and flexible.

In an embodiment, the second printing layer 602 may include the black matrix 2083 of the color filter layer 2080 and the black pixel defining layer 2055 as a black area in the panel (e.g., the display panel 630 of FIG. 18). The second printing layer 602 may have a pole-less structure.

Figure 20B:
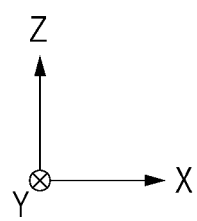
Figure 21:
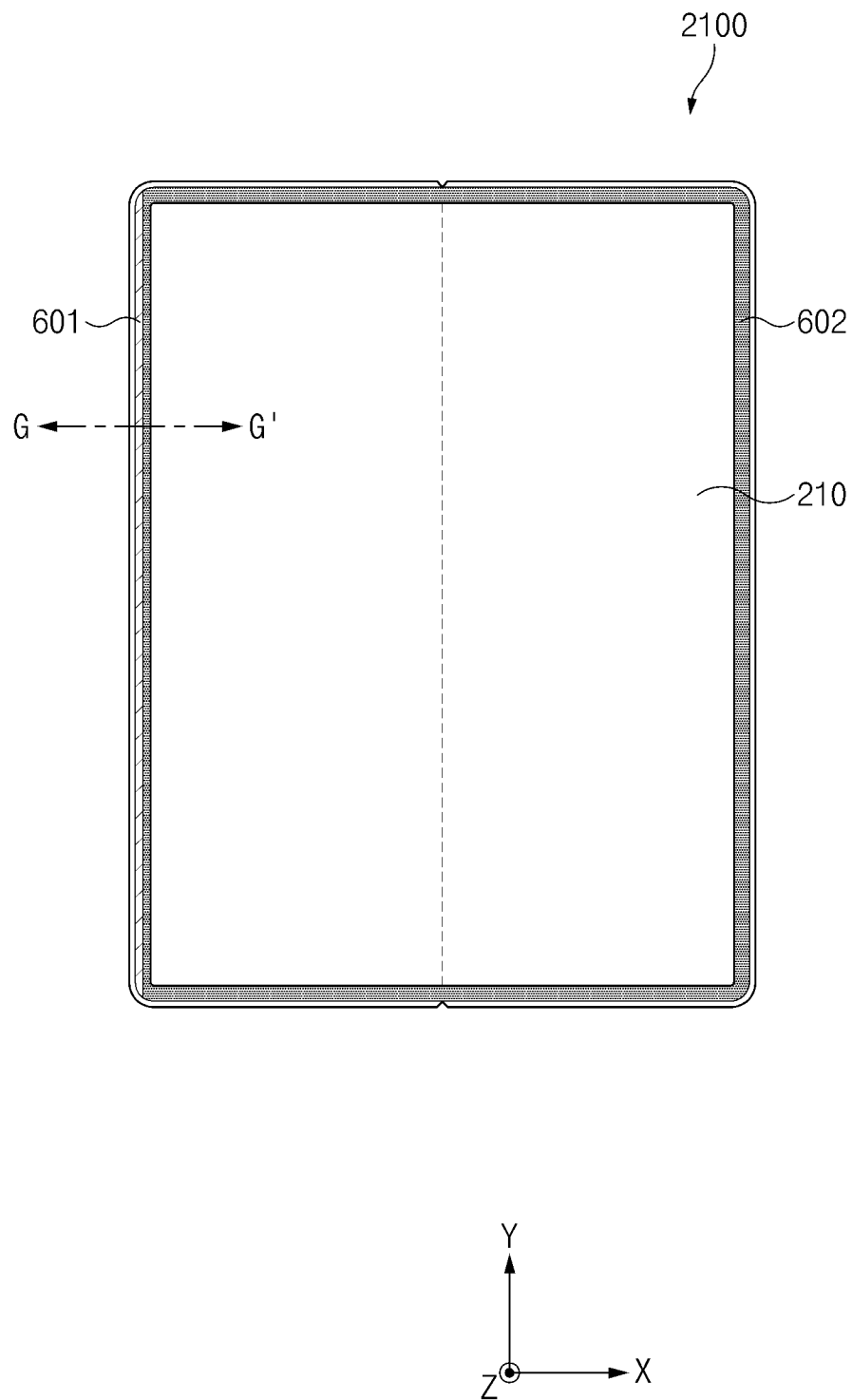
FIG. 21 is a front view of an electronic device according to various embodiments.
Figure 22:
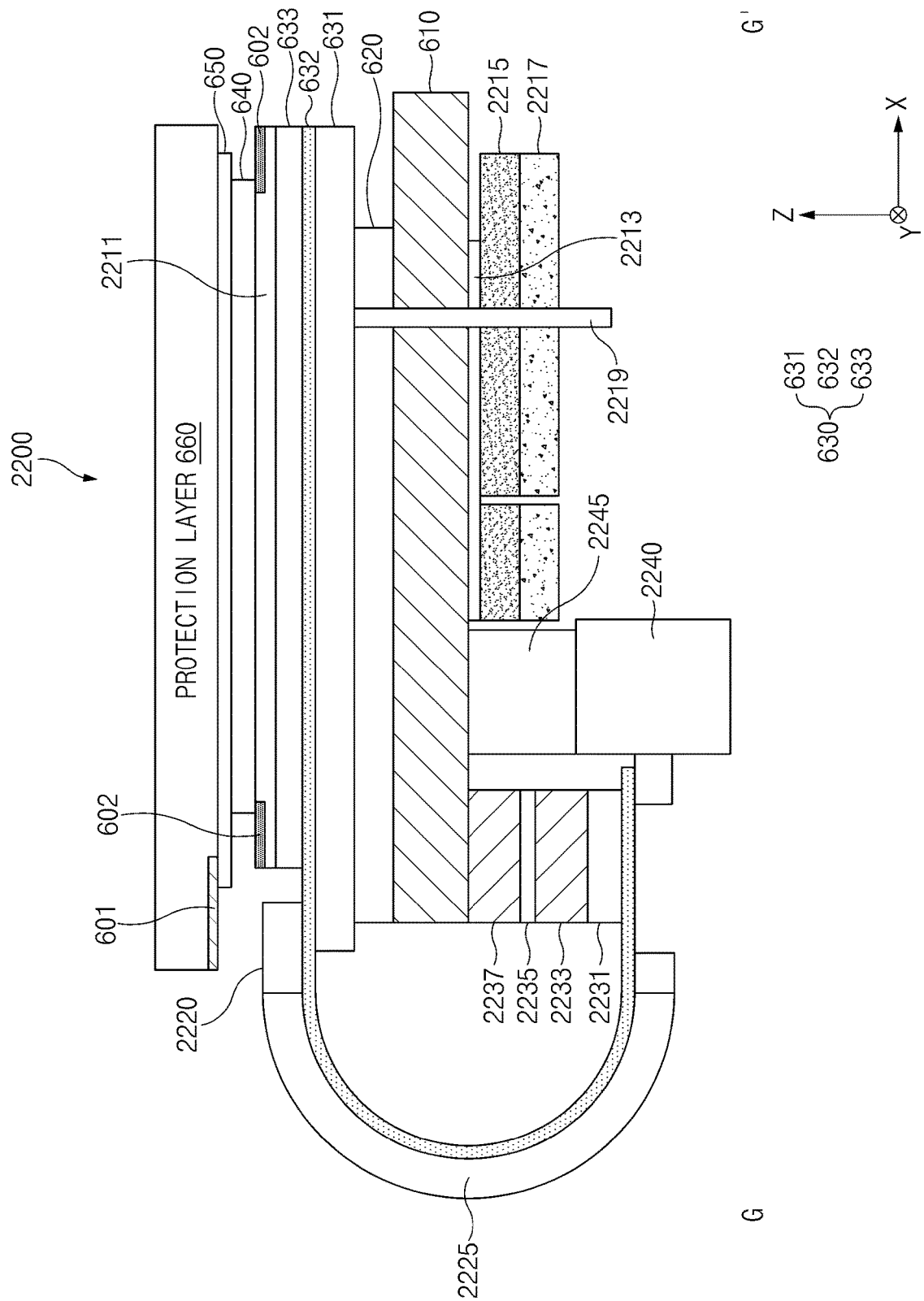
FIG. 22 is a cross-sectional view taken along line G-G' of FIG. 21 various embodiments.

FIG. 21 is a front view 2100 of the foldable electronic device 101 according to various embodiments. FIG. 22 is a cross-sectional view 2200 taken along line G-G' of FIG. 21 according to various embodiments. The metal layer 610, the panel lower side protecting layer 620, the display panel 630, the bonding layer 640, the glass 650, and the protection layer 660 of FIG. 20 may be substantially the same as or similar to the metal layer 610, the panel lower side protecting layer 620, the display panel 630, the bonding layer 640, the glass 650, and the protection layer 660 of the display 210 of FIG. 6.

In an embodiment, the second printing layer 602 may be disposed along three edge portions of the display 210. For example, the second printing layer 602 may be disposed along an upper edge portion, a lower edge portion, and a right edge portion of the display 210.

In an embodiment, the first printing layer 601 and the second printing layer 602 may be disposed along one edge portion of the display 210. For example, the first printing layer 601 and the second printing layer 602 may be disposed along a left edge portion of the display 210. A width of the second printing layer 602 disposed along the one edge portion of the display 210 may be smaller than a width of the second printing layer 602 disposed along the three edge portions of the display 210. A display driver IC (e.g., the display driver IC 230 of FIG. 2) may be disposed at the one edge portion of the display 210.

In an embodiment, the second printing layer 602 under the glass 650 such as UTG may be disposed along the three edge portions, except for the edge portion, at which the display driver IC 230 is disposed. The second printing layer 602 may be disposed with a width that is smaller than those of the remaining edge portions, except for the edge portion, at which the display driver IC 230 is disposed. Accordingly, a physical size, by which the display driver IC 230 may be disposed, may be secured.

In an embodiment, the first printing layer 601 may be additionally disposed along the one edge of the display 210. By additionally disposing the first printing layer 601, a phenomenon, in which the display panel 630 is exposed and visually recognized from an outside, may be prevented or avoided when the second printing layer 602 is disposed at the edge portion, at which the display driver IC 230 is disposed, with a small width. Because a crack of the glass 650 is inspected only in the folding part, the printing layer may be disposed to an end of the folding part, at which the polyimide (PL) of the display panel 630 is disposed.

In an embodiment, when a size of the area, in which the display driver IC 230 may be disposed, is small, the second printing layer 602 may be disposed only at the three edge portions of the display 210. The first printing layer 601 may be disposed at the edge portion, at which the display driver IC 230 is disposed. The first printing layer 601 may be printed to at least partially overlap the glass 650.

In an embodiment, the second printing layer 602 may be disposed in a damping layer 2211 that is disposed on the bonding layer 640 to absorb an impact. The damping layer 2211 may include a material, such as PET, which may absorb an impact.

In an embodiment, a bonding layer 2213, a metal layer 2215, and a cushion layer 2217 may be additionally disposed under the metal layer 610. A sensor hole 2219 may be formed to pass through the panel lower side protecting layer 620, the metal layer 610, the bonding layer 2213, the metal layer 2215, and the cushion layer 2217.

In an embodiment, a bending protection layer (BPL) 2220 may be disposed on one side of the display panel 630. A bending part 2225 may be connected to the bending protection layer 2220.

In an embodiment, the bending part 2225 may have a fixed state while maintaining a specific distance from a lower surface of the display panel 630 through a film layer 2231, a first column spacer 2233, a graphene layer 2235, and a second column spacer 2237.

In an embodiment, one side of the bending part 2225 may be connected to an FPCB 2240. The FPCB 2240 may be connected to a lower side of the display panel 630 through a conductive tape 2245.

Figure 23:
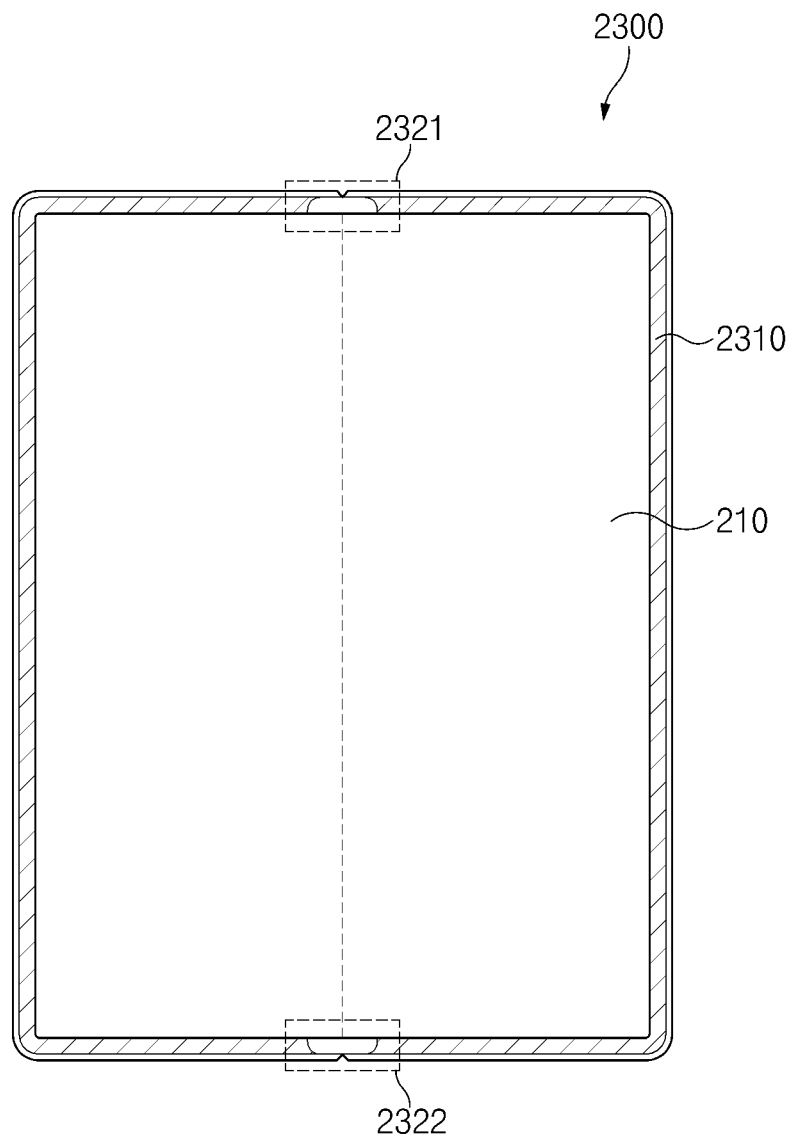
FIG. 23 is a front view of an electronic device according to various embodiments.
Figure 23:
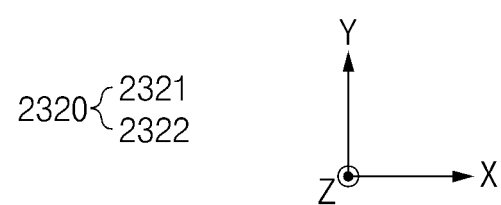
Figure 24:
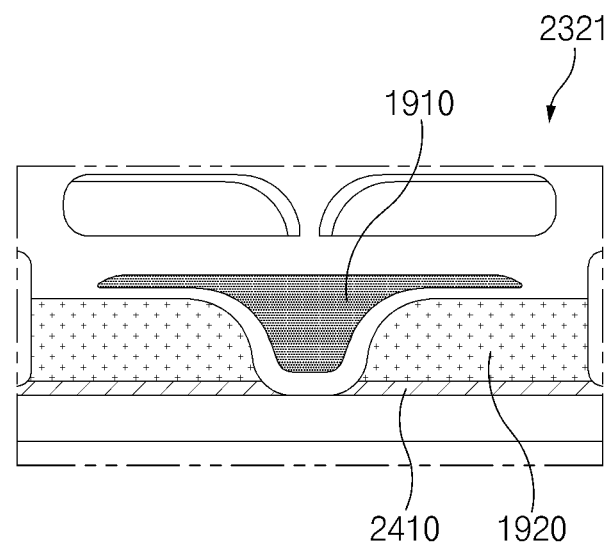
FIG. 24 is a front view of a first mechanism part of an electronic device according to various embodiments.
Figure 25:
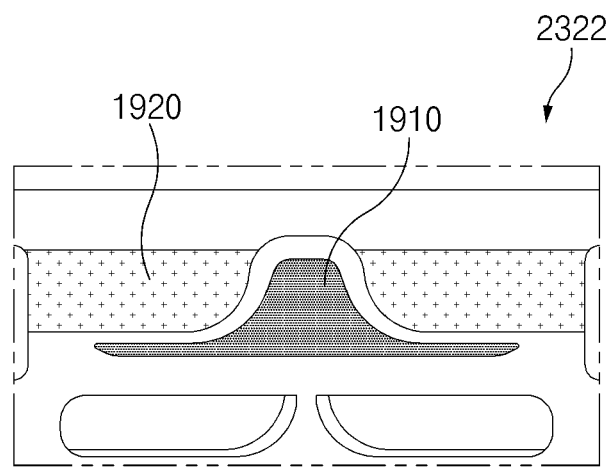
FIG. 25 is a front view of a second mechanism part of an electronic device according to various embodiments.

FIG. 23 is a front view 2300 of the foldable electronic device 101 according to various embodiments. FIG. 24 is a front view of a first mechanism part 2321 of the electronic device 101 according to various embodiments. FIG. 25 is a front view of a second mechanism part 2322 of the electronic device 101 according to various embodiments.

In an embodiment, a single printing layer 2310 may surround an outskirt of the display 210 of the electronic device 101. The single printing layer 2310 may be disposed at an outskirt portion of the display 210, except for a mechanism part 2320. The mechanism part 2320 may include the first mechanism part 2321 and the second mechanism part 2322. Multiple printing layers (e.g., the first printing layer 601 and the second printing layer 602 of FIG. 6) may be disposed in the first mechanism part 2321 and the second mechanism part 2322.

In an embodiment, printing structures for respective areas may be different according to a mechanism structure of an upper end of the display 210. For example, in the first mechanism part 2321, in which the cover member 1920 is disposed, a degree, by which the light of the display 210 is covered, may be decreased by a tension even through decorative members (e.g., the decorative member 1510 of FIG. 15) and the printing layers 601 and 602 are designed in one-to-one correspondence to each other. Accordingly, as illustrated in FIG. 24, a problem, in which a non-printing part 2410 is visually recognized, may be caused. When the second mechanism part 2322 is designed such that the printing layers 601 and 602 protrude than the decorative member 1510, as illustrated in FIG. 25, a problems, in which the non-printing part is visually recognized, may be addressed, but it influences the folding and may be disadvantageous in an aspect of design due to a step on an external shape thereof.

In an embodiment, multiple printing structures may be applied only to an area of the cover member 1920. The multiple printing structures may be implemented using the first printing layer 601 and the second printing layer 602. The second printing layer 602, as described in the detailed description of the disclosure, may be located in several layers. For example, the second printing layer 602 may be disposed on the panel (e.g., the display panel 630 of FIG. 6), in an interior of the panel 630, and under the panel 630.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a foldable display panel;
a glass disposed in a first direction facing a front surface of the foldable display panel;
a protection layer disposed in the first direction of the glass;
a bonding layer disposed between the foldable display panel and the glass;
a first printing layer disposed between the glass and the protection layer; and
a second printing layer disposed in a second direction opposite the first direction,
wherein the first printing layer is spaced apart from an edge of the glass in a third direction facing an active area of the foldable display panel,
wherein one end of the second printing layer corresponds to an edge of the foldable display panel, and
wherein at least a portion of the second printing layer is disposed under the bonding layer in a second direction.

2. The electronic device of claim 1, wherein the first printing layer and the second printing layer at least partially overlap each other when viewed from the first direction.

3. The electronic device of claim 1, wherein the second printing layer is disposed on the foldable display panel.

4. The electronic device of claim 1, further comprising:
a panel lower side protecting layer disposed in the second direction of the foldable display panel.

5. The electronic device of claim 4, wherein the second printing layer is disposed between the foldable display panel and the panel lower side protecting layer.

6. The electronic device of claim 1, wherein the second printing layer comprises a black bonding layer disposed in an interior of the foldable display panel.

7. The electronic device of claim 4, further comprising:
a metal layer disposed in the second direction of the panel lower side protection layer,
wherein the second printing layer is disposed between the metal layer and the panel lower side protecting layer.

8. The electronic device of claim 1, wherein the second printing layer comprises a black printing layer disposed in an interior of the foldable display panel.

9. The electronic device of claim 1, wherein an inspection area is formed at a peripheral portion of the first printing layer or the second printing layer disposed at a periphery of the foldable display panel which contacts a folding area with which the foldable display panel is in contact; and
wherein the first printing layer or the second printing layer disposed in the inspection area has a width that is less than a width of the first printing layer or the second printing layer disposed at the remaining areas.

10. The electronic device of claim 9, wherein at least a portion of the first printing layer or the second printing layer disposed in the inspection area is cut.

11. The electronic device of claim 1, further comprising:
a mechanism part disposed at an upper central area and a lower central area of the electronic device,
wherein the mechanism part includes a lattice pattern area including a plurality of lattice patterns formed of the first printing layer.

12. The electronic device of claim 11, wherein an offset width of the mechanism part, by which the first printing layer is offset, is greater than a width of the lattice pattern area.

13. The electronic device of claim 1, wherein the second printing layer is disposed along three edge portions not including an edge portion at which a display driver IC configured to drive the foldable display panel is disposed.

* * * * *